United States Patent
Wu et al.

(10) Patent No.: US 12,317,578 B2
(45) Date of Patent: May 27, 2025

(54) SEMICONDUCTOR DEVICES WITH LOW LEAKAGE CURRENT AND METHODS OF FABRICATING THE SAME

(71) Applicant: Taiwan Semiconductor Manufacturing Company, Ltd., Hsinchu (TW)

(72) Inventors: Ming-Yuan Wu, Hsinchu (TW); Ka-Hing Fung, Hsinchu County (TW); Min Jiao, Hsinchu (TW); Da-Wen Lin, Hsinchu (TW); Wei-Yuan Jheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 407 days.

(21) Appl. No.: 17/834,202

(22) Filed: Jun. 7, 2022

(65) Prior Publication Data
US 2023/0395436 A1    Dec. 7, 2023

(51) Int. Cl.
*H10D 84/01*    (2025.01)
*H01L 21/02*    (2006.01)
(Continued)

(52) U.S. Cl.
CPC ..... *H10D 84/038* (2025.01); *H01L 21/02532* (2013.01); *H01L 21/0259* (2013.01);
(Continued)

(58) Field of Classification Search
CPC ....... H01L 21/823892; H01L 21/02532; H01L 21/0259; H01L 21/022; H01L 21/26513;
(Continued)

(56) References Cited

U.S. PATENT DOCUMENTS 6,667,222 B1    12/2003    Su et al.
10,164,012 B2    12/2018    Fung et al.
(Continued)

FOREIGN PATENT DOCUMENTS

TW    201926572 A    7/2019
TW    202205436 A    2/2022

OTHER PUBLICATIONS

Lin, et al. Silicon Nitride Films Deposited by Atmospheric Pressure Chemical Vapor Deposition (Year: 1998).*

*Primary Examiner* — Peniel M Gumedzoe
*Assistant Examiner* — Douglas Yap
(74) *Attorney, Agent, or Firm* — HAYNES AND BOONE, LLP

(57) ABSTRACT

Semiconductor devices and methods are provided. In an embodiment, a method includes providing a workpiece including a first hard mask layer on a top surface of a substrate, performing an ion implantation process to form a doped region in the substrate, after the performing of the ion implantation process, annealing the workpiece at temperature T1. The method also includes selectively removing the first hard mask layer, after the selectively removing of the first hard mask layer, performing a pre-bake process at temperature T2, and, after the performing of the pre-bake process, epitaxially growing a vertical stack of alternating channel layers and sacrificial layers on the substrate, where the temperature T2 is lower than the temperature T1.

20 Claims, 23 Drawing Sheets

(51) Int. Cl.
 H01L 21/265 (2006.01)
 H01L 21/266 (2006.01)
 H10D 30/01 (2025.01)
 H10D 30/67 (2025.01)
 H10D 62/10 (2025.01)
 H10D 64/01 (2025.01)
 H10D 84/03 (2025.01)
 H10D 84/85 (2025.01)

(52) U.S. Cl.
 CPC .... *H01L 21/0262* (2013.01); *H01L 21/26513* (2013.01); *H01L 21/266* (2013.01); *H10D 30/031* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/0191* (2025.01); *H10D 84/859* (2025.01)

(58) Field of Classification Search
 CPC ........... H01L 21/266; H01L 21/823807; H01L 21/823814; H01L 27/0928; H01L 29/42392; H01L 29/66545; H01L 29/66742; H01L 29/78696; H01L 29/0847; H01L 21/823493; H10D 84/0156; H10D 84/038; H10D 84/0191; H10D 84/501–509; H10D 84/118–123
 See application file for complete search history.

(56) References Cited

U.S. PATENT DOCUMENTS

| | | | |
|---|---|---|---|
| 2012/0164806 A1 | 6/2012 | Nishikawa | |
| 2015/0155301 A1 | 6/2015 | Adam | |
| 2017/0005094 A1* | 1/2017 | Tai | H01L 29/7833 |
| 2017/0154958 A1* | 6/2017 | Fung | H01L 29/42392 |
| 2019/0051765 A1 | 2/2019 | Cheng | |
| 2019/0096997 A1* | 3/2019 | More | H01L 21/823821 |
| 2019/0157154 A1* | 5/2019 | Wang | H01L 21/823481 |
| 2022/0223690 A1* | 7/2022 | More | H01L 21/823807 |
| 2023/0012358 A1* | 1/2023 | Liaw | H01L 29/41775 |
| 2023/0290890 A1* | 9/2023 | Feng | H01L 29/8725 |

\* cited by examiner

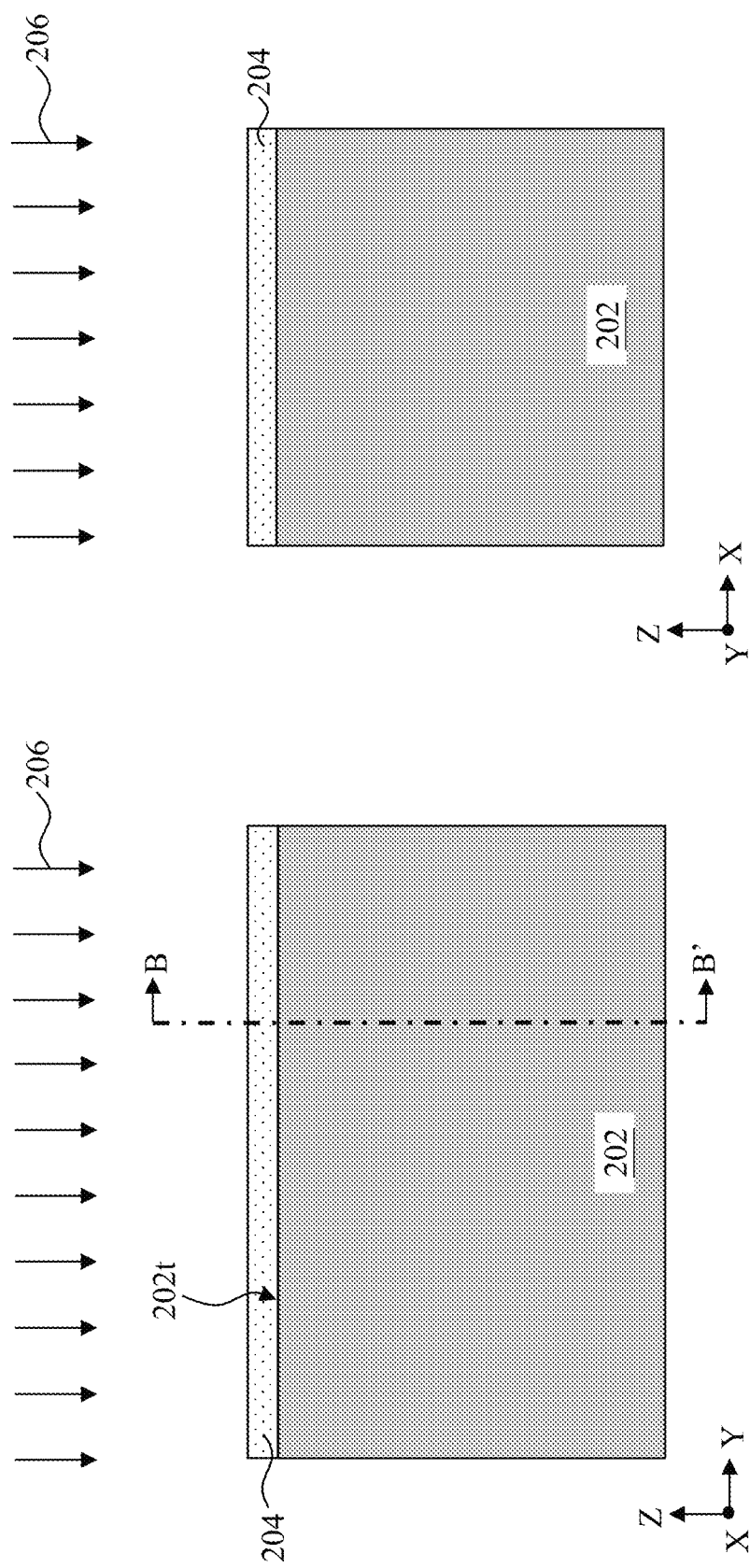

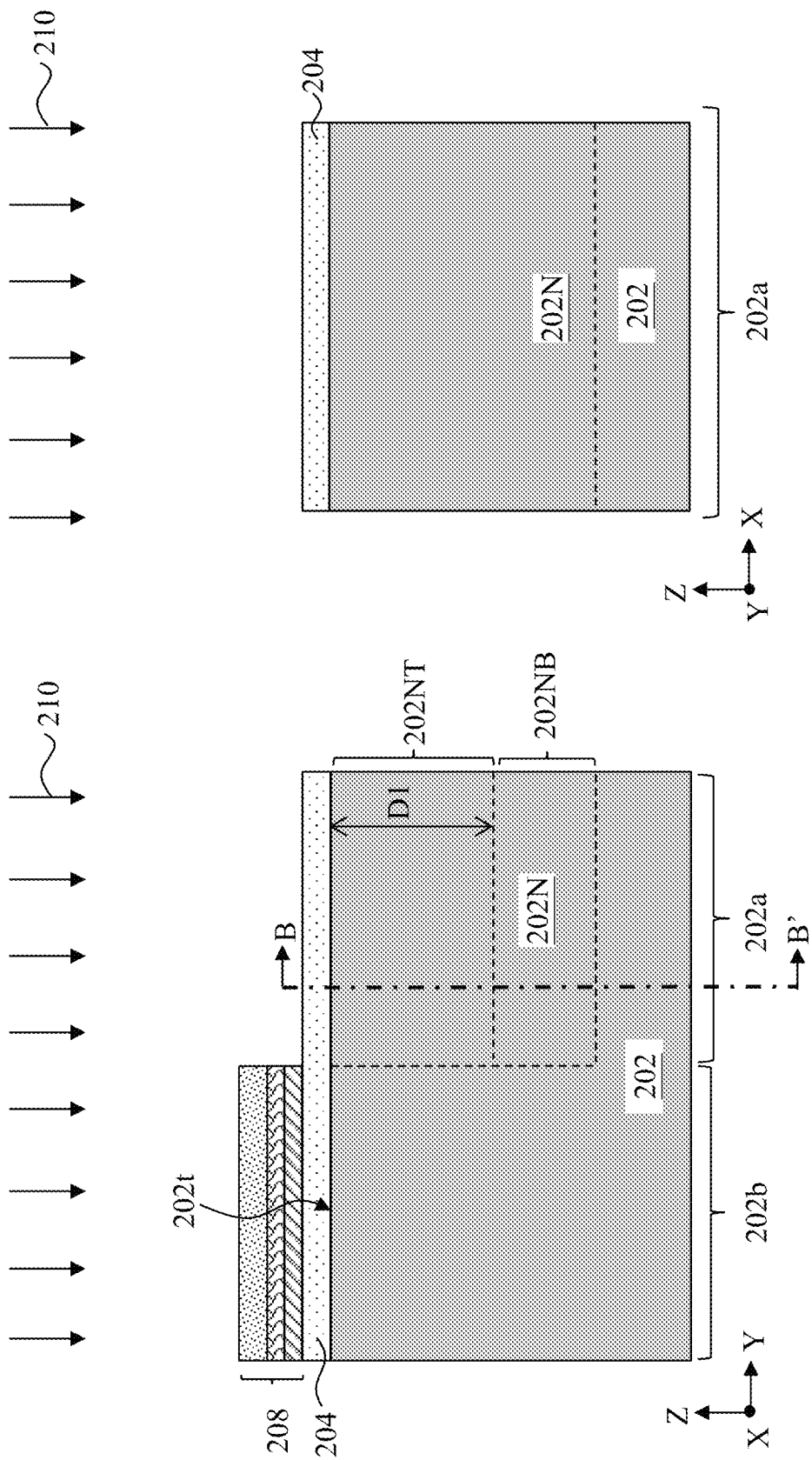

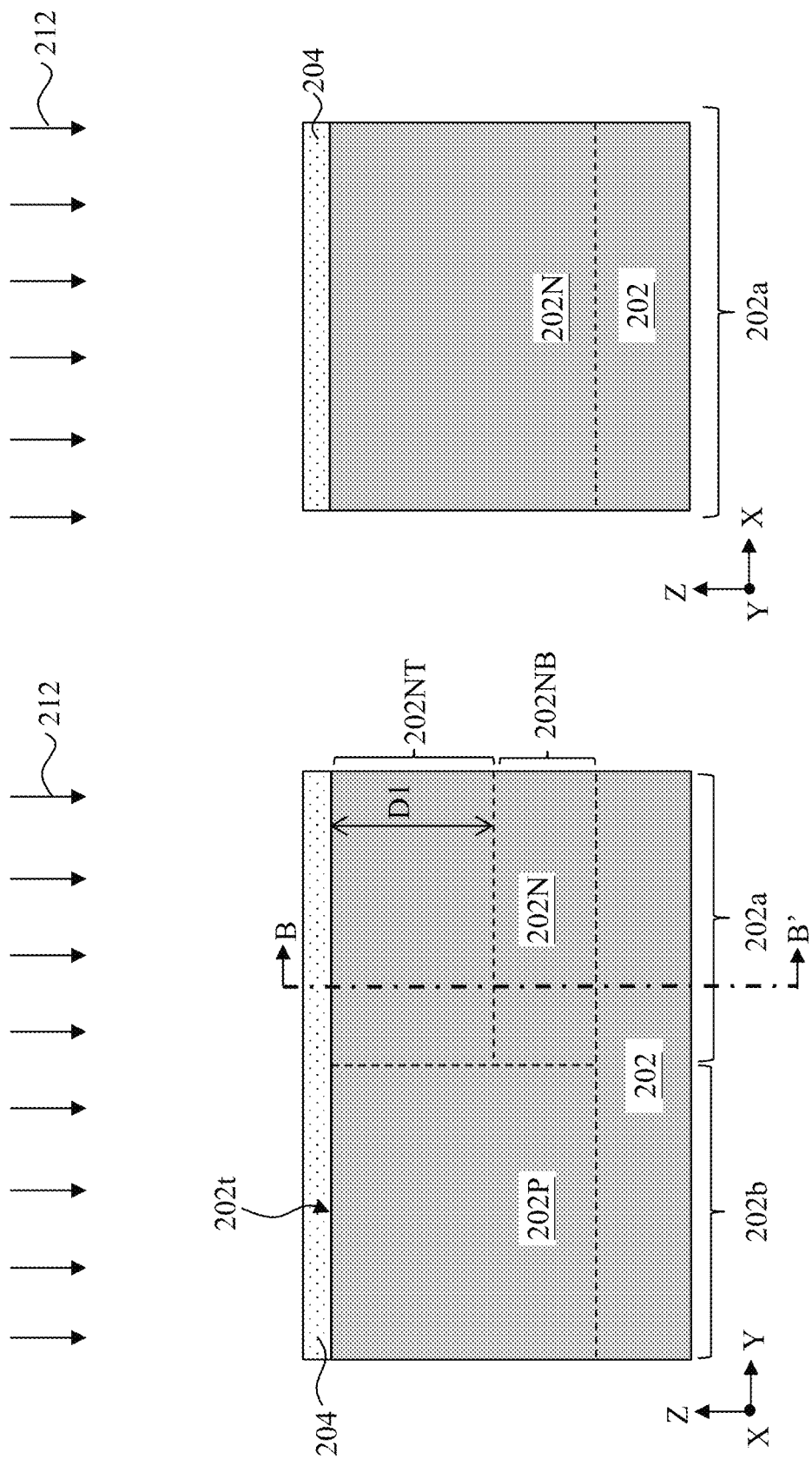

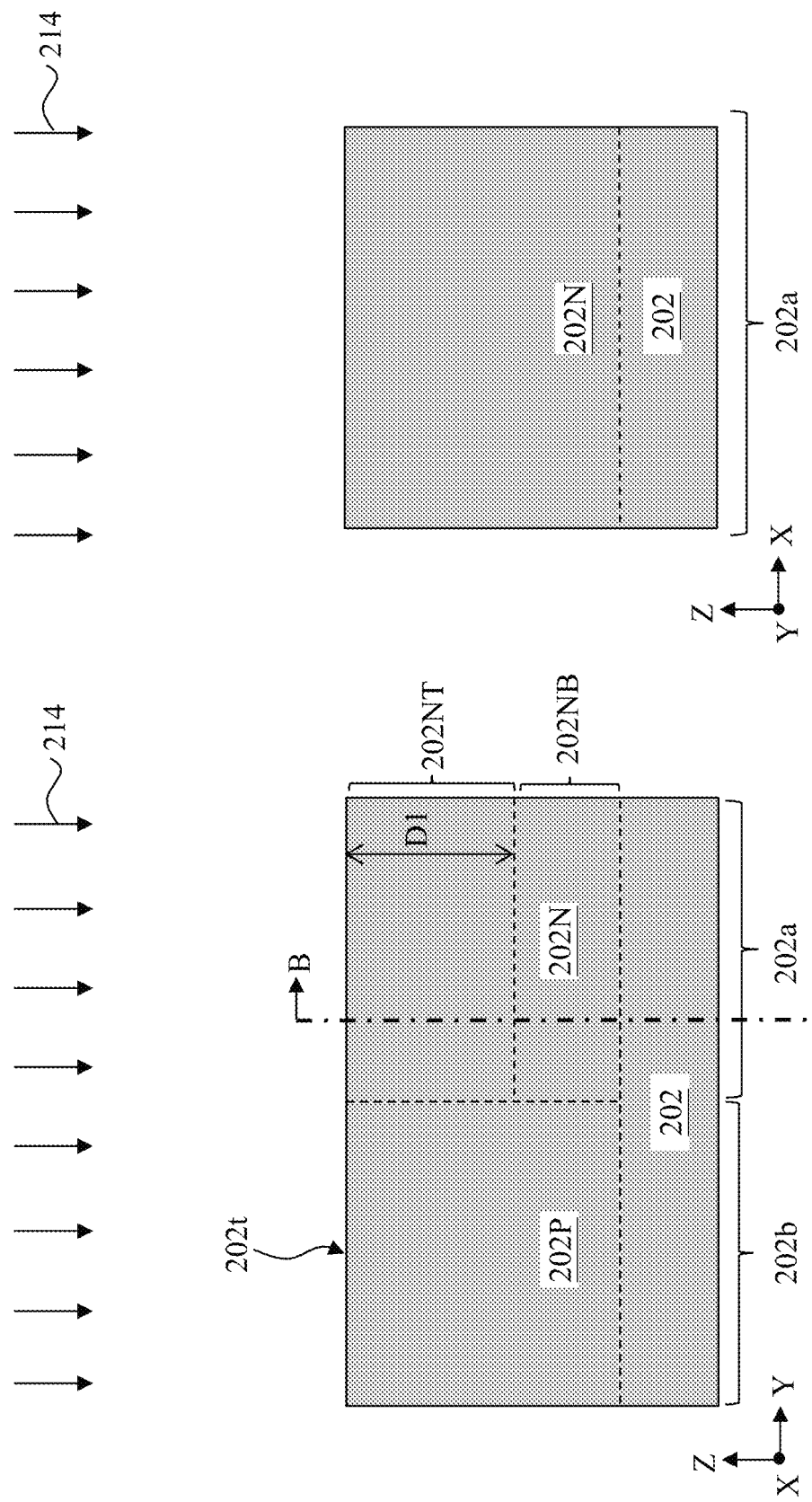

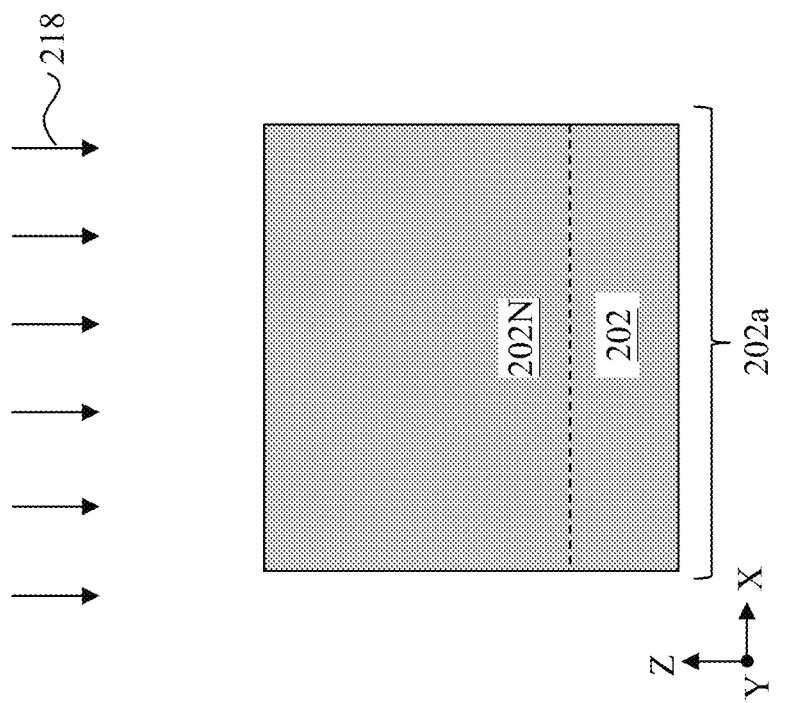
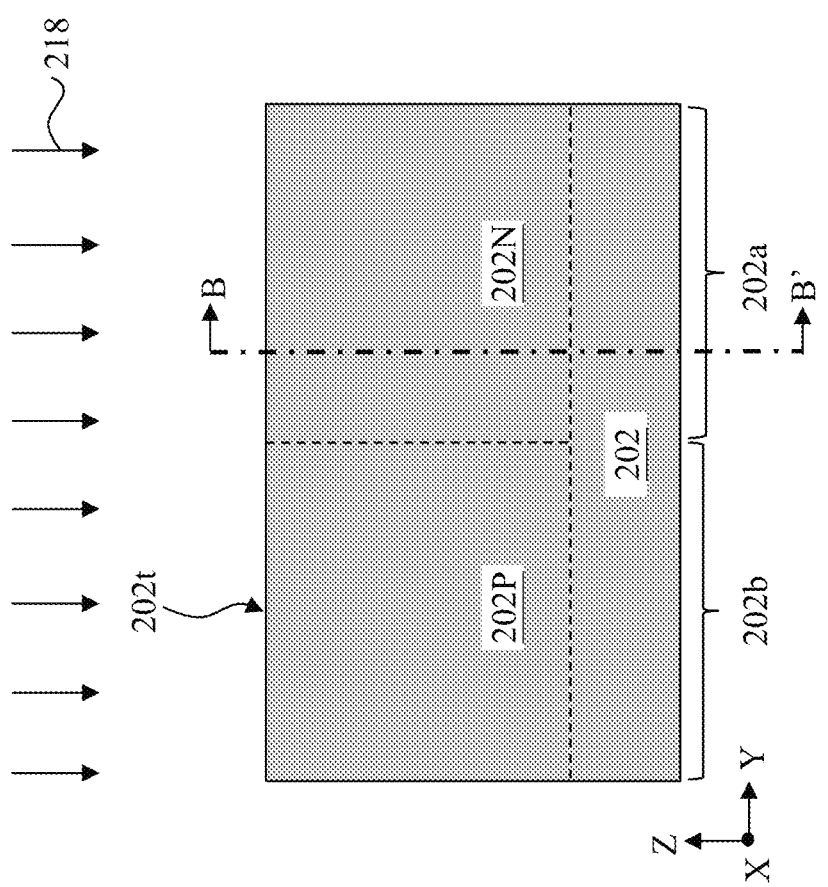

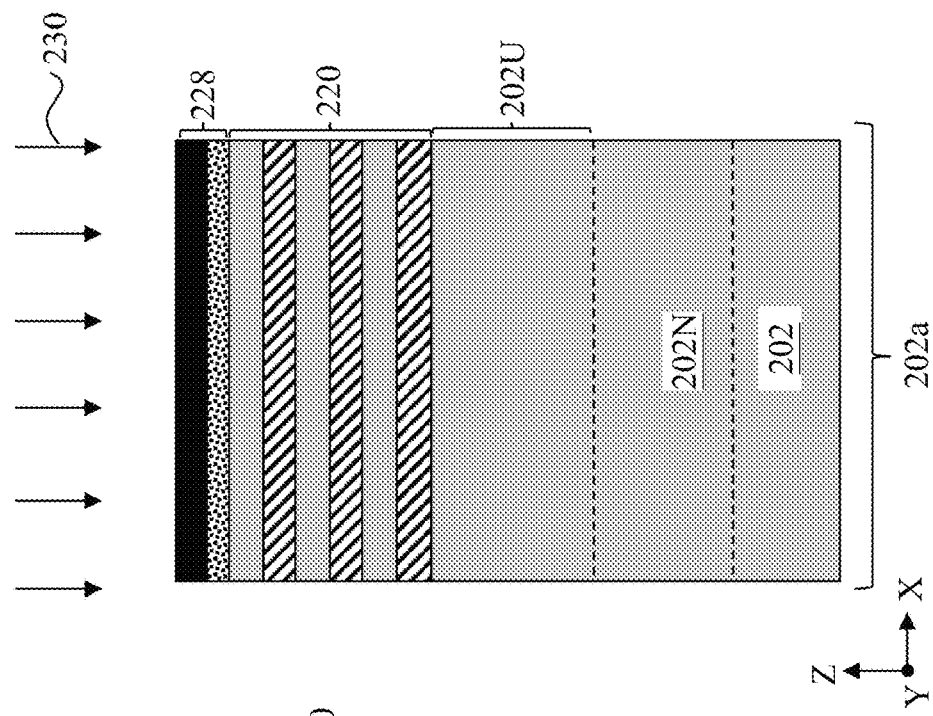
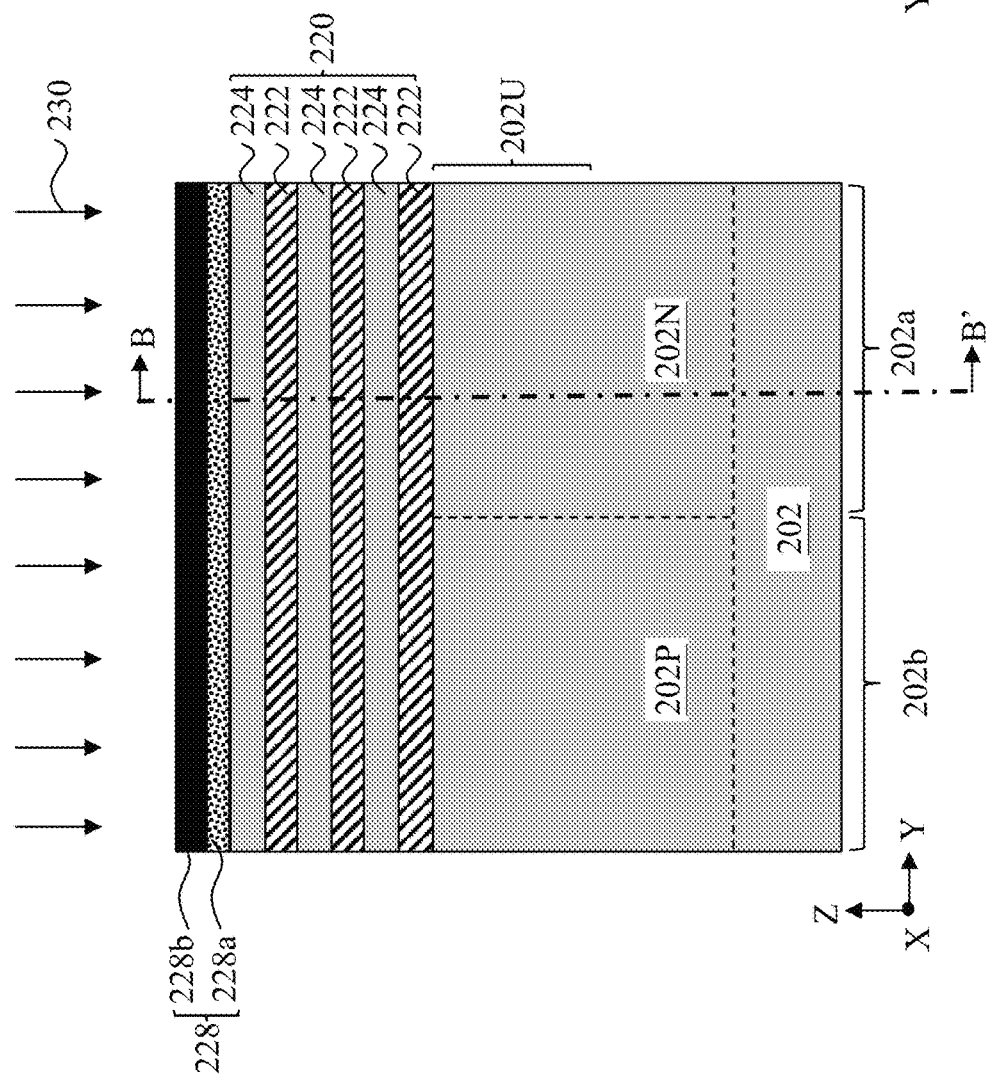
FIG. 9A
FIG. 9B

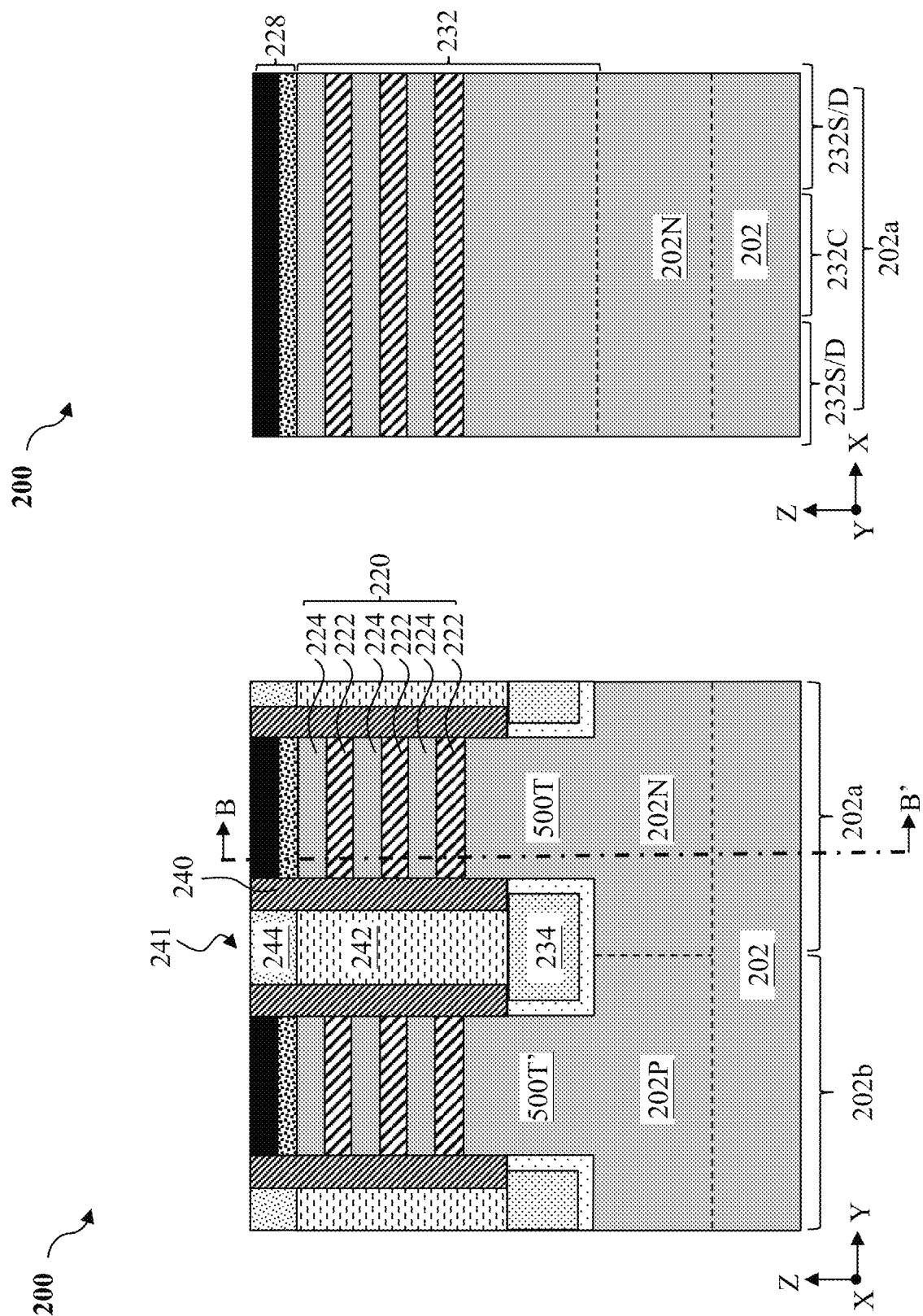

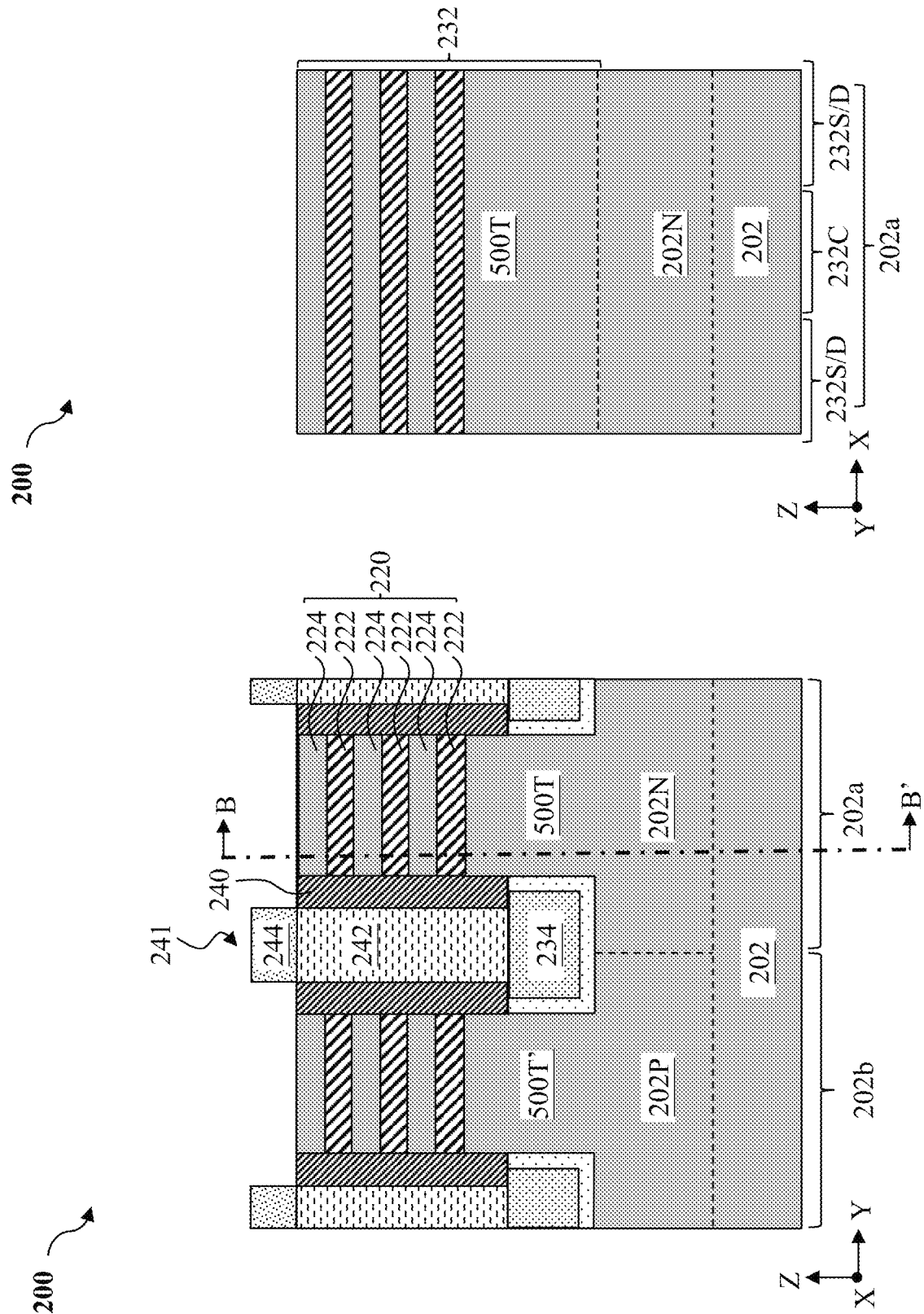

| Thermal process | Temperature | Duration | Pressure | Flow rate |
|---|---|---|---|---|
| First process 206 | 600°C-1200°C | <6h | 1 atmosphere | 0.1-10 slm of $H_2$, $O_2$ and/or 1,2, DCE |
| Anneal process 212 | 950°C-1200°C | <60s | 1 atmosphere | 10-100 slm of $N_2$ or Ar |
| Pre-back process 218 | 700°C-100550°C | <300s | <300 torr | 0.1-50 slm of $H_2$, $N_2$, He, Ar |
| Selective CVD process 226 | 600°C-800 °C | >3mins | <300 torr | several sccm to slm of $SiH_4$, $Si_2H_6$, $SiCH_2Cl_2$, $SiHCl_3$, $SiCl_4$; $GeH_4$, $Ge_2H_6$, $GeCl_4$ |
| Second process 230 | 60°C-390°C | 1-10 mins | 1500-4500 mTorr | 1-10slm of $O_2$/SAM24 |
| Flowable CVD process 236 | 400°C-800°C | 4-10 hours | 1 atmosphere | 3-20 slm of $H_2O$, $N_2$ |

FIG. 19B

SEMICONDUCTOR DEVICES WITH LOW LEAKAGE CURRENT AND METHODS OF FABRICATING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or a portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. While existing MBC transistor structures are generally adequate for their general purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A and 17A (FIGS. 2A-17A) illustrate fragmentary cross-sectional views of an exemplary workpiece during various fabrication stages in the method of FIG. 1, according to one or more aspects of the present disclosure.

FIGS. 2B, 3B, 4B, 5B, 6B, 7B, 8B, 9B, 10B, 11B, 12B, 13B, 14B, 15B, 16B and 17B (FIGS. 2B-17B) illustrate fragmentary cross-sectional views of an exemplary workpiece during various fabrication stages in the method of FIG. 1, according to one or more aspects of the present disclosure.

FIG. 19B illustrates a table showing ranges of parameters of the thermal treatments, according to various embodiments of the present disclosure.

DETAILED DESCRIPTION

Figure 1:
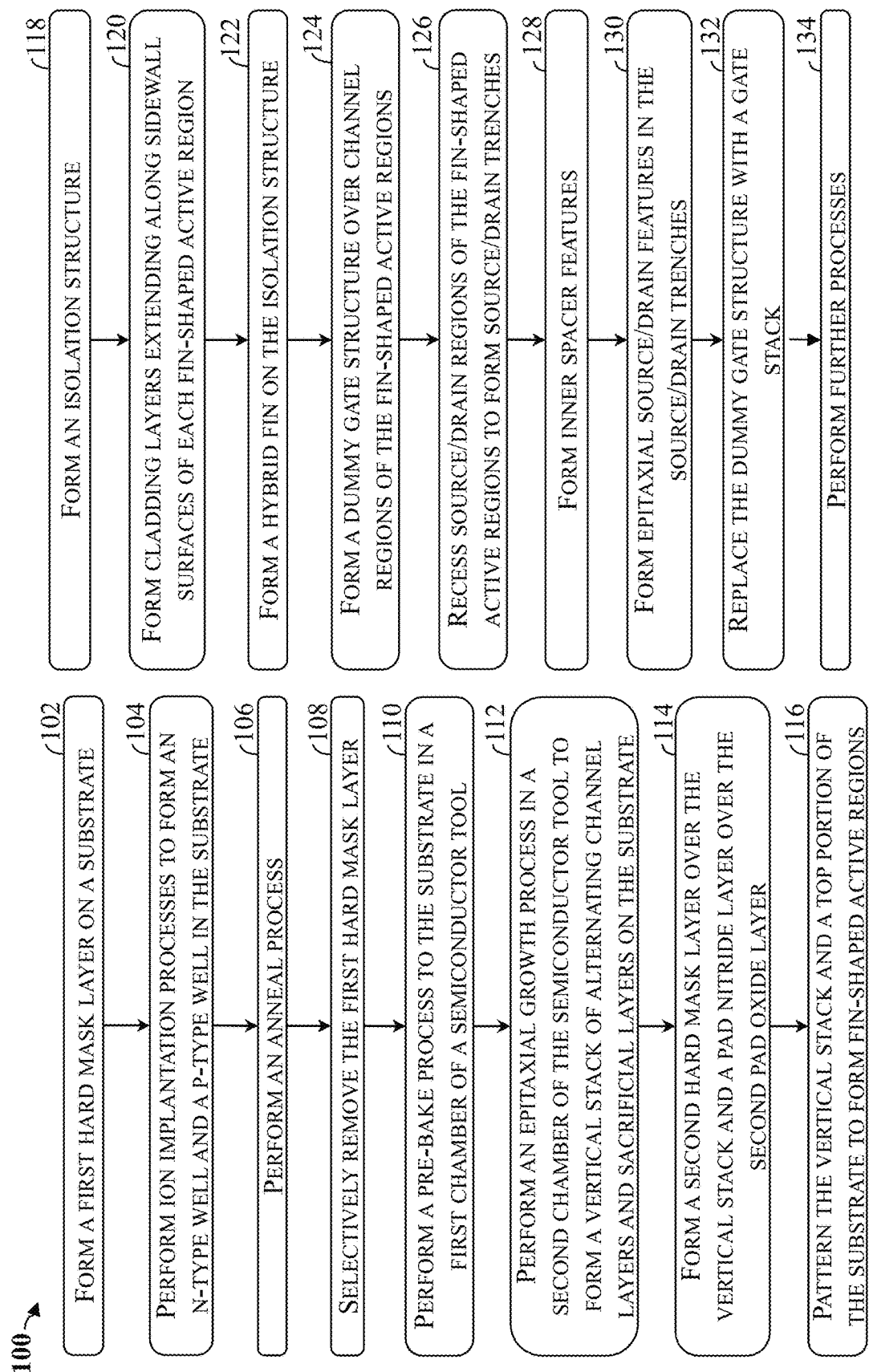
FIG. 1 illustrates a flowchart of an exemplary method for fabricating a semiconductor device, according to various embodiments of the present disclosure.
Figure 3B:
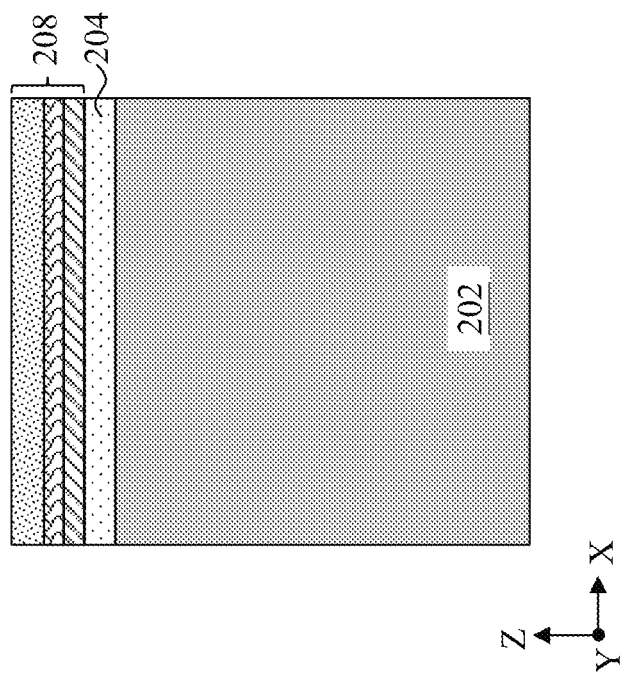
Figure 3A:
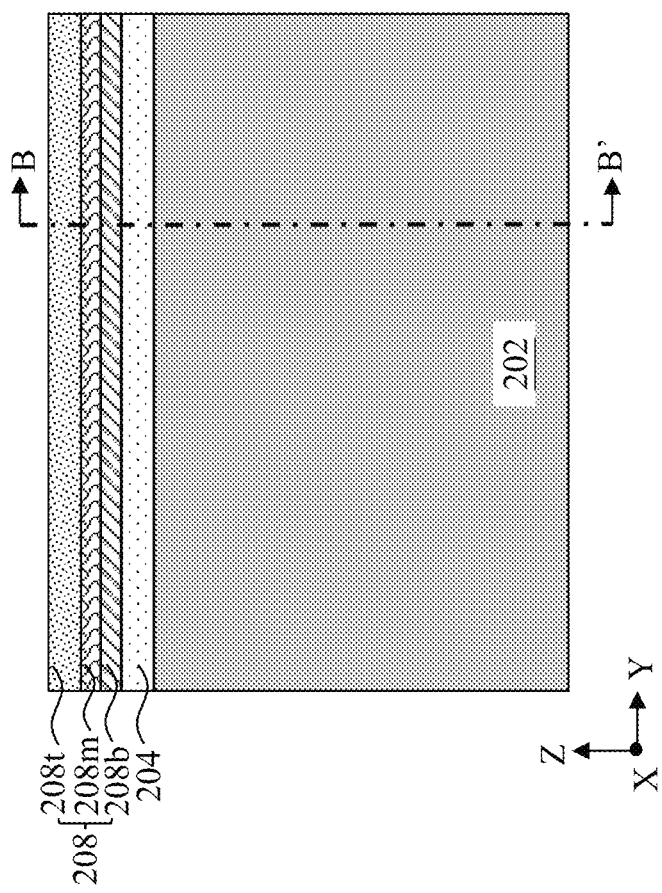

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Formation of an MBC transistor includes formation of a stack that includes a number of channel layers interleaved by a number of sacrificial layers over a substrate, where the sacrificial layers may be selectively removed to release the channel layers as channel members. The stack and a portion of the substrate are patterned to form active regions. A gate structure that includes a dielectric layer and a conductive layer is then formed to wrap around and over each of the channel members. However, in some instances, MBC transistors may suffer current leakage near the patterned portion (i.e., mesa region or mesa structure) of the substrate. More specifically, n-type MBC transistors may be formed in and over a p-type well (e.g., boron-doped p well) in the substrate, p-type MBC transistors may be formed in and over an n-type well (e.g., phosphorous-doped n well) in the substrate. Due to the implementation of some thermal treatments (e.g., annealing, oxidation) during the formation of the n-type MBC transistors and p-type MBC transistors, dopants (e.g., phosphorous) in the n-type well of the p-type MBC transistors may diffuse into the p-type well of the n-type MBC transistors, reducing the dopant concentration in the mesa region of the n-type MBC transistors, thereby increasing the junction leakage. As the separation spacing of two adjacent active regions becomes smaller, the undesired diffusion may be more severe. Although increasing an implant dosage of an ion implantation process for forming the n-type well may increase the dopant concentration in the mesa region, the number of dopants that are available to diffuse during the thermal treatments also increase, leading to a further degraded device performance.

The present disclosure provides methods for forming semiconductor devices with reduced leakage current. In an embodiment, a method includes providing a workpiece including a first hard mask layer on a top surface of a substrate, performing an ion implantation process to form a doped region in the substrate, after the performing of the ion implantation process, annealing the workpiece at temperature T1. The method also includes selectively removing the first hard mask layer, after the selectively removing of the first hard mask layer, performing a pre-bake process at temperature T2, and, after the performing of the pre-bake process, epitaxially growing a vertical stack of alternating channel layers and sacrificial layers on the substrate, where the temperature T2 is lower than the temperature T1.

Figure 7C:
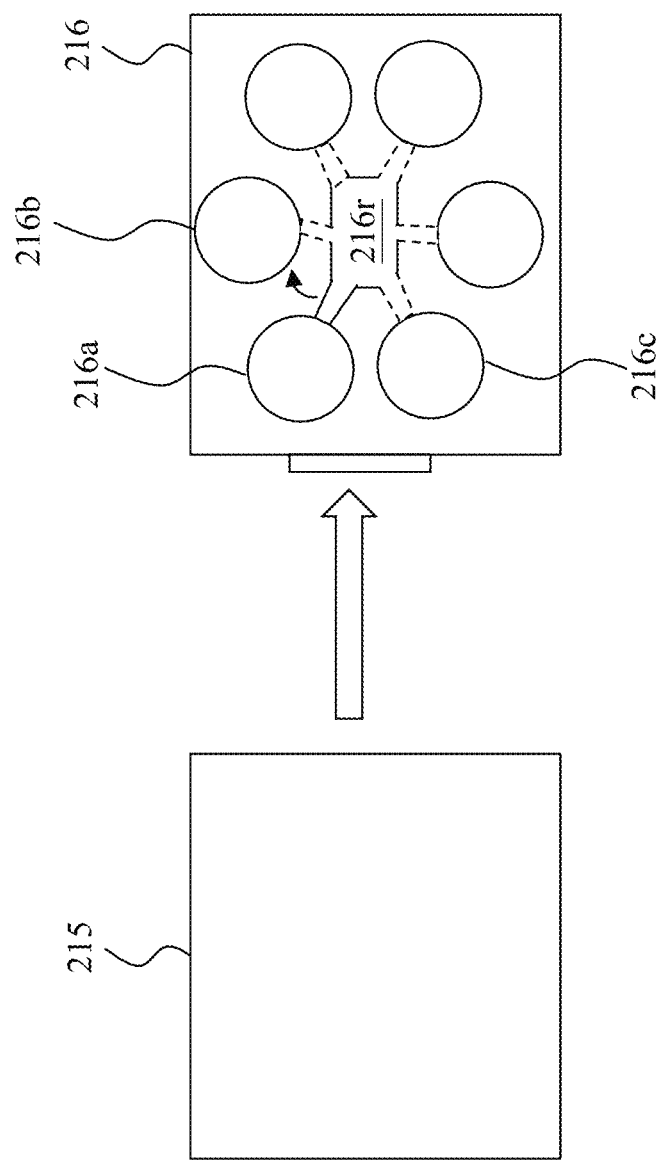
FIG. 7C shows a block diagram of a tool used during various fabrication stages in the method of FIG. 1, according to one or more aspects of the present disclosure.

The various aspects of the present disclosure will now be described in more detail with reference to the figures. In that regard, FIG. 1 is a flowchart illustrating method 100 of forming a semiconductor device according to embodiments of the present disclosure. Method 100 is described below in conjunction with FIGS. 2A-17A and FIGS. 2B-17B, which are fragmentary cross-sectional views of a workpiece 200 at different fabrication stages, FIG. 7C, which is a block diagram of tools used at different fabrication stages, and FIGS. 19A-19B, 20 and 21, which are parameters of thermal treatments at different fabrication stages and the mesa region's doping profiles, according to embodiments of method 100. FIGS. 2B-17B depict cross-sectional views of the workpiece 200 taken along line B-B' shown in FIGS. 2A-17A during various fabrication stages in the method 100. Method 100 is merely an example and is not intended to limit the present disclosure to what is explicitly illustrated therein. Additional steps may be provided before, during and after the method 100 and some steps described can be replaced, eliminated, or moved around for additional embodiments of the method. Not all steps are described herein in detail for reasons of simplicity. Because the workpiece 200 will be fabricated into a semiconductor device 200 upon conclusion of the fabrication processes, the workpiece 200 may be referred to as the semiconductor device 200 as the context requires. For avoidance of doubts, the X, Y and Z directions in FIGS. 2A-17A and FIGS. 2B-17B are perpendicular to one another and are used consistently throughout FIGS. 2A-17A and FIGS. 2B-17B. FIG. 18 is a flowchart illustrating a method 300 of determining and fine-tuning parameters of thermal treatments involved in several fabrication stages of the method of FIG. 1, according to embodiments of the present disclosure. Method 300 is described below in conjunction with FIGS. 2A-17A and FIGS. 2B-17B and further in conjunction with FIGS. 19A-19B, 20 and 21, according to embodiments of method 300. Method 300 is merely an example and is not intended to limit the present disclosure to what is explicitly illustrated therein. Additional steps may be provided before, during and after the method 300 and some steps described can be replaced, eliminated, or moved around for additional embodiments of the method. Throughout the present disclosure, like reference numerals denote like features unless otherwise excepted.

Referring to FIGS. 1, 2A and 2B, method 100 includes a block 102 where a first hard mask layer 204 is formed on a top surface 202t of a substrate 202. In an embodiment, the substrate 202 is a bulk silicon substrate (i.e., including bulk single-crystalline silicon). The substrate 202 may include other semiconductor materials in various embodiments, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In some alternative embodiments, the substrate 202 may be a semiconductor-on-insulator substrate, such as a silicon-on-insulator (SOI) substrate, a silicon germanium-on-insulator (SGOI) substrate, or a germanium-on-insulator (GeOI) substrate, and includes a carrier, an insulator on the carrier, and a semiconductor layer on the insulator.

The first hard mask layer 204 is then formed on the top surface 202t of the substrate 202. In embodiments represented in FIGS. 2A-2B, the first hard mask layer 204 is a single-layer structure and includes a pad oxide layer formed by using a first process 206. The first process 206 may be a chemical vapor deposition (CVD) process, an atomic layer deposition (ALD) process, a thermal oxidation process, or other suitable processes. In an embodiment, the first process 206 includes a thermal oxidation process and the pad oxide layer includes silicon oxide. The thermal oxidation process may be performed under 1 atmosphere (atm) and at a process temperature T0 ranging from about 600° C. to about 1200° C. in a process environment that may include one or more reaction gases such as $H_2$, $O_2$ and/or 1,2-Dichloroethylene (DCE) for a duration t0 of several hours with a flow rate of about 0.1 standard liter per minute (slm) to about 10 slm. Carrier gases such as $N_2$, Ar, He may be used to transport the reaction gases into a furnace or a process chamber. The process temperature T0 is designed such that metal contamination on the top surface 202t of the substrate 202 may be removed and metal gatherings may be reduced during subsequent fabrication stages. The first hard mask layer 204 may provide protection for the substrate 202 during subsequent fabrication stages. In some other implementations, the first hard mask layer 204 may be a multi-layer structure and may further include a pad nitride (e.g., silicon nitride) layer formed on the pad oxide layer.

After forming the first hard mask layer 204, a patterned photoresist layer may be formed on the first hard mask layer 204, a first etching process may be applied to pattern the first hard mask layer 204, and a second etching process may be then conducted to remove a portion of the substrate 202 exposed by the first hard mask layer 204 to form a trench.

The trench may be used as an alignment mark during subsequent fabrication stages. After the forming of the trench, the pad nitride layer may be selectively removed, leaving the pad oxide layer on the top surface 202t of the substrate 202 according to some embodiments.

Referring to FIGS. 1. 3A, 3B, 4A and 4B, method 100 includes a block 104 where one or more ion implantation processes are performed to form an N-type well and/or a P-type well in the substrate 202. After forming the first hard mask layer 204, a mask layer 208 is formed over the substrate 202, such as on the first hard mask layer 204. The mask layer 208 may include one or more material layers, such as a bottom layer 208b, a middle layer 208m, and a top photoresist layer 208t. In some embodiments, the bottom layer 208b may include a hard mask material such as a carbon-containing material. The middle layer 208m may include anti-reflective materials (e.g., a backside anti-reflective coating (BARC) layer) to aid the exposure and focus of the top photoresist layer 208t.

The mask layer 208 may be then patterned to expose a first portion 202a of the substrate 202 while a second portion 202b of the substrate 202 is covered, as exemplary shown in FIGS. 4A and 4B. The first hard mask layer 204 covers both the first portion 202a and the second portion 202b of the substrate 202 as an implantation screen layer. P-type MBC transistors may be formed on the first portion 202a and n-type MBC transistors may be formed on the second portion 202b. With the patterned mask layer 208 as an implant mask, an ion implantation process 210 is performed to form an N-type doped region 202N in the first portion 202a of the substrate 202. If the implant dosage of the implantation process 210 is too high, although a mesa region (e.g., mesa region 500T shown in FIG. 17A) may maintain a satisfactory dopant concentration after a number of thermal treatments, more dopants may diffuse into adjacent devices and/or adjacent features, leading to worse device performance. If the implant dosage of the implantation process 210 is too low, the mesa region may not have a sufficient and satisfactory dopant concentration, leading to an increased leakage current.

Figure 20:
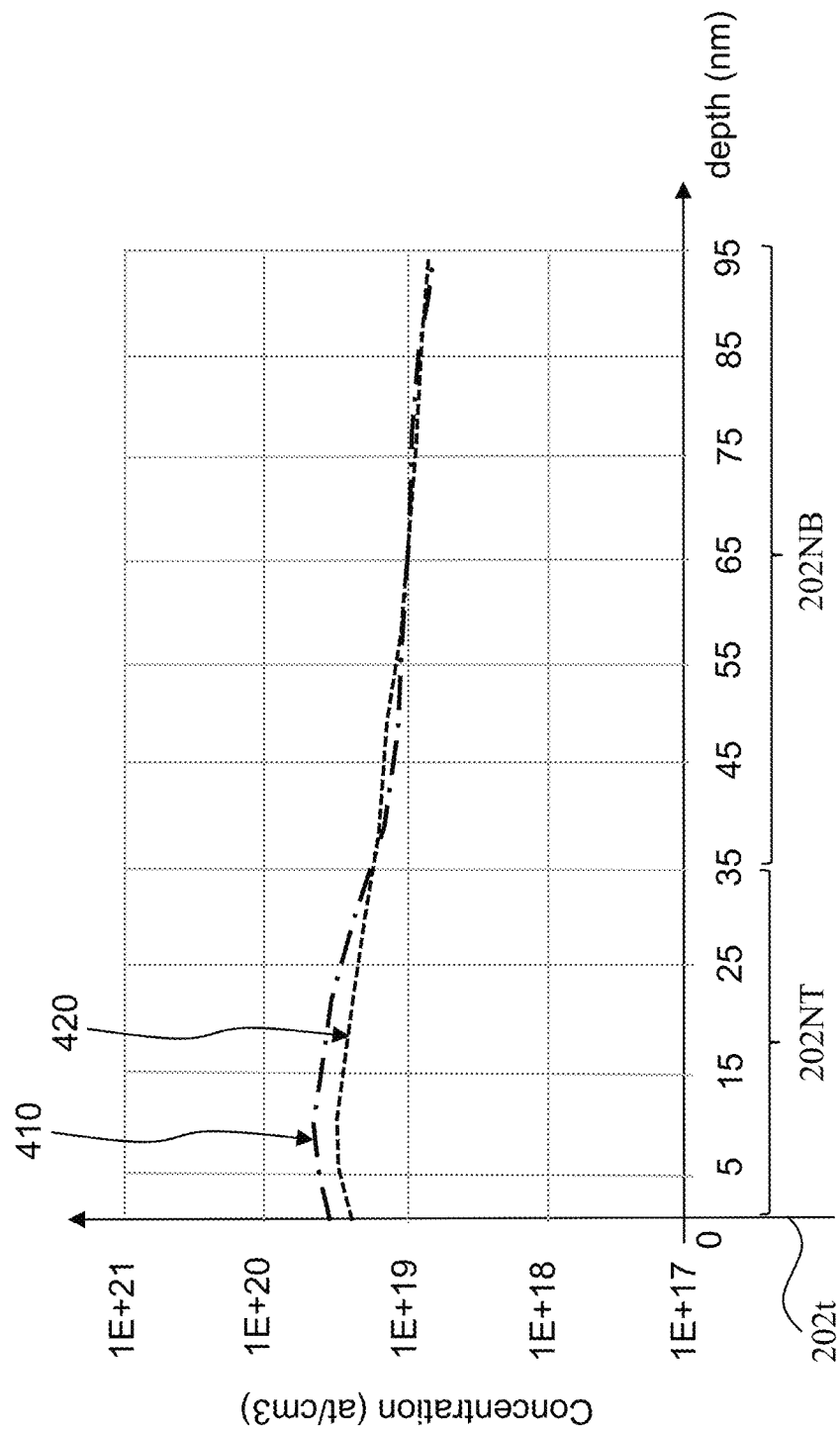
FIG. 20 illustrates doping profiles of a doped region of the workpiece before and after performing an anneal process.

The n-type doped region 202N may include n-type dopants, such as phosphorus (P), arsenic (As), other n-type dopants, or combinations thereof. A depth of the n-type doped region 202N may be between about 300 nm and about 500 nm, and a dopant concentration of the n-type doped region 202N may be not uniform throughout its depth along the Z axis. A doping profile of the n-type doped region 202N after the implantation process 210 is shown in FIG. 20 and is represented by curve 410. For example, in the present embodiment, a top portion 202NT of the n-type doped region 202N may have a dopant concentration C1 greater than about 1E19 atoms/cm3. A depth D1 (from the top surface 202t of the substrate 202) of the top portion 202NT may be between about 30 nm and about 50 nm. A dopant concentration C2 of a bottom portion 202NB of the n-type doped region 202N is less than the dopant concentration C1 and is less than 1E19 atoms/cm3. In some embodiments, the n-type doped region 202N may include or may be a part of an n-well structure. After the implantation process 210, the patterned mask layer 208 may be selectively removed. Similar operations (e.g., forming a patterned mask layer to expose the second portion 202b of the substrate 202 while the first portion 202a of the substrate 202 is covered and then performing an ion implantation process) may be performed to form a p-type doped region 202P (shown in FIG. 5A) in the second portion 202b of the substrate 202. The p-type doped region 202P may include p-type dopants, such as boron (B), boron difluoride ($BF_2$), other p-type dopant, or combinations thereof. The p-type doped region 202P may include or may be a part of a p-well structure. In some embodiments, a doping profile of the p-type doped region 202P may be in a way similar to the doping profile of the n-type doped region 202N. In some other implantations, instead of performing the ion implantation process 210, a diffusion process and/or other suitable doping process may be used to form the n-type doped region 202N and the p-type doped region 202P. It is understood that the p-type doped region 202P may be formed before forming the n-type doped region 202N, in some other embodiments.

Referring to FIGS. 1, 5A and 5B, method 100 includes a block 106 where an anneal process 212 is performed to the workpiece 200 after the performing of the ion implantation process 210. The anneal process 212 is performed using a thermal budget, which defines a total amount of thermal energy transferred to the workpiece during the given elevated temperature operation, such as a product of a process temperature and a process duration (i.e., process temperature multiplied by the process duration). The total thermal budget associated with a final semiconductor device 200 is an accumulation of thermal energies transferred to the intermediate workpiece 200 through all thermal processes, such as the summation of thermal budgets through all thermal processes, which cannot be greater than the allowable total thermal budget. The anneal process 212 may include a rapid thermal process (RTP), a laser spike anneal process, a flash anneal process, a furnace anneal process, other suitable thermal process, or combinations thereof. The anneal process 212 may include an anneal temperature T1 ranging from about 950° C. and to about 1200° C. such that the anneal process 212 may activate dopants in the n-type doped region 202N and/or dopants in the p-type doped region 202P and also facilitate movement of the dopants from interstitial sites to substitutional lattice sites to reduce dislocations in crystal lattice and repair defects caused by the ion implantation process 210. Due to the thermal budget and the anneal temperature of the anneal process 212, the anneal temperature T1 may be maintained for a duration t1 measured by seconds or microseconds. For example, the duration t1 of the anneal process 212 may be less than about 60 seconds. The anneal process 212 may be performed under 1 atmosphere (atm) and in a gas environment that includes gases such as oxygen, helium (He), nitrogen ($N_2$), argon (Ar), hydrogen ($H_2$), combinations thereof, and/or other suitable gases. In embodiments where the gas environment includes multiple gases, a flow rate of nitrogen ($N_2$) or Argon (Ar) may be between about 10 slm and 100 slm. After the anneal process 212, a doping profile of the n-type doped region 202N may change due to thermal diffusion caused by the anneal process 212. The doping profile of the n-type doped region 202N is shown in FIG. 20 and is represented by curve 420. More specifically, the dopant concentration of at least a part of the top portion 202NT of the n-type doped region 202N may decrease, the dopant concentration of the bottom portion 202NB of the n-type doped region 202N may increase, compared to the doping profile of the n-type doped region 202N (represented by curve 410 shown in FIG. 20) before the anneal process 212.

Referring to FIGS. 1, 6A and 6B, method 100 includes a block 108 where the first hard mask layer 204 is selectively removed by an etching process 214 (e.g., a wet etching process) without substantially damaging the substrate 202. In embodiments where the first hard mask layer 204 includes the pad oxide layer, a dilute HF dip process may be performed to remove the first hard mask layer 204. It is understood that the etching process 214 may be performed in an etching tool 215 (shown in FIG. 7C) that is different from the tool used for the anneal process 212.

Referring to FIGS. 1, 7A, 7B and 7C, method 100 includes a block 110 where a pre-bake process 218 is performed to the workpiece 200. After the performing of the etching process 214, the workpiece 200 may be transferred from the etching tool 215 to an integrated process system 216. The integrated process system 216 may be a cluster tool (such as a CVD tool) including multiple process chambers (e.g., process chambers 216a, 216b, 216c) configured to conduct various fabrication processes therein and one or more robot arms 216r for motion. It is understood that, after the etching process 214, there may be residues of the first hard mask layer 204 left on the top surface of the substrate 202, and during the transportation of the workpiece 200 from the etching tool 215 to the integrated process system 216, the exposed top surface 202t of the substrate 202 may be oxidized. In addition, the performing of the etching process 214 may cause a moist substrate 202. Therefore, after being transferred to the integrated process system 216 (e.g., CVD tool), the workpiece 200 may be placed in a first process chamber 216a of the integrated process system 216 and an in-situ preclean process may be performed. In some embodiments, the in-situ preclean process may be a chemical oxide removal process that implements a combination of fluorine-containing gas (e.g., NF3, HF, and/or other suitable fluorine-containing gases) and catalytic gas (e.g., NH3, H2O, alcohol, and/or other suitable gases). After the performing of the preclean process in the first process chamber 216a, the workpiece 200 may be transferred by the robot arm 216r from the first process chamber 216a to a second process chamber 216b (shown in FIG. 7C), and a pre-bake process 218 is then performed in the second process chamber 216b at temperature T2 to evaporate the solvent in the substrate 202 for a time duration t2 that is sufficient to dry the workpiece 200 as well as remove any undesirable components (i.e., oxide residue and/or unintentionally formed oxidized layer) on the top surface 202t of the substrate 202.

In an embodiment, the pre-bake process 218 is performed after the removal of the first hard mask layer 204 and before the epitaxial growth of semiconductor layers. The thermal budget of the pre-bake process 218 may be less than the thermal budget of the anneal process 212. In some other technologies, the pre-bake process 218 may be performed at temperature T2 that may be higher than the anneal temperature T1 to further reduce the defects caused by the ion implantation process 210. However, in the present disclosure, the temperature T2 is lower than the anneal temperature T1 to reduce the diffusion of dopants. The defects caused by the ion implantation process 210 may be reduced by other subsequent processes. In an embodiment, the temperature T2 may be between about 700° C. and about 1000° C. If the temperature T2 is below 700° C., the pre-bake process 218 may not be able to remove the undesirable components (i.e., oxide residue and/or unintentionally formed oxidized layer) on the top surface 202t of the substrate 202. That is, the temperature T2 is greater than the desorption temperature of the pad oxide layer 204 and the desorption temperature of the unintentionally formed oxidized layer. If the temperature T2 is above 1000° C., too many dopants in the n-type doped region 202N and p-type doped region 202P may diffuse into adjacent regions, reducing the dopant concentration in the mesa region and thus disadvantageously increasing the leakage current. Considering the thermal budget and the pre-bake temperature T2 of the pre-bake process 218, the pre-bake temperature T2 may be maintained for a duration t2 that may be greater than the duration t1 of the anneal process 212. In an embodiment, the duration t2 of the pre-bake process 218 may be between several seconds and hundred seconds, and the anneal process 212 may include a spike anneal that may be performed for less than one second. In embodiments, the duration t2 of the pre-bake process 218 is less than 300 seconds. In an embodiment, t2 is between about 80 seconds and about 120 seconds to evaporate the solvent in the substrate 202 while providing the mesa region (e.g., mesa region 500T shown in FIG. 17A) a satisfactory doping profile, thereby reducing the leakage current of the workpiece 200.

Figure 21:
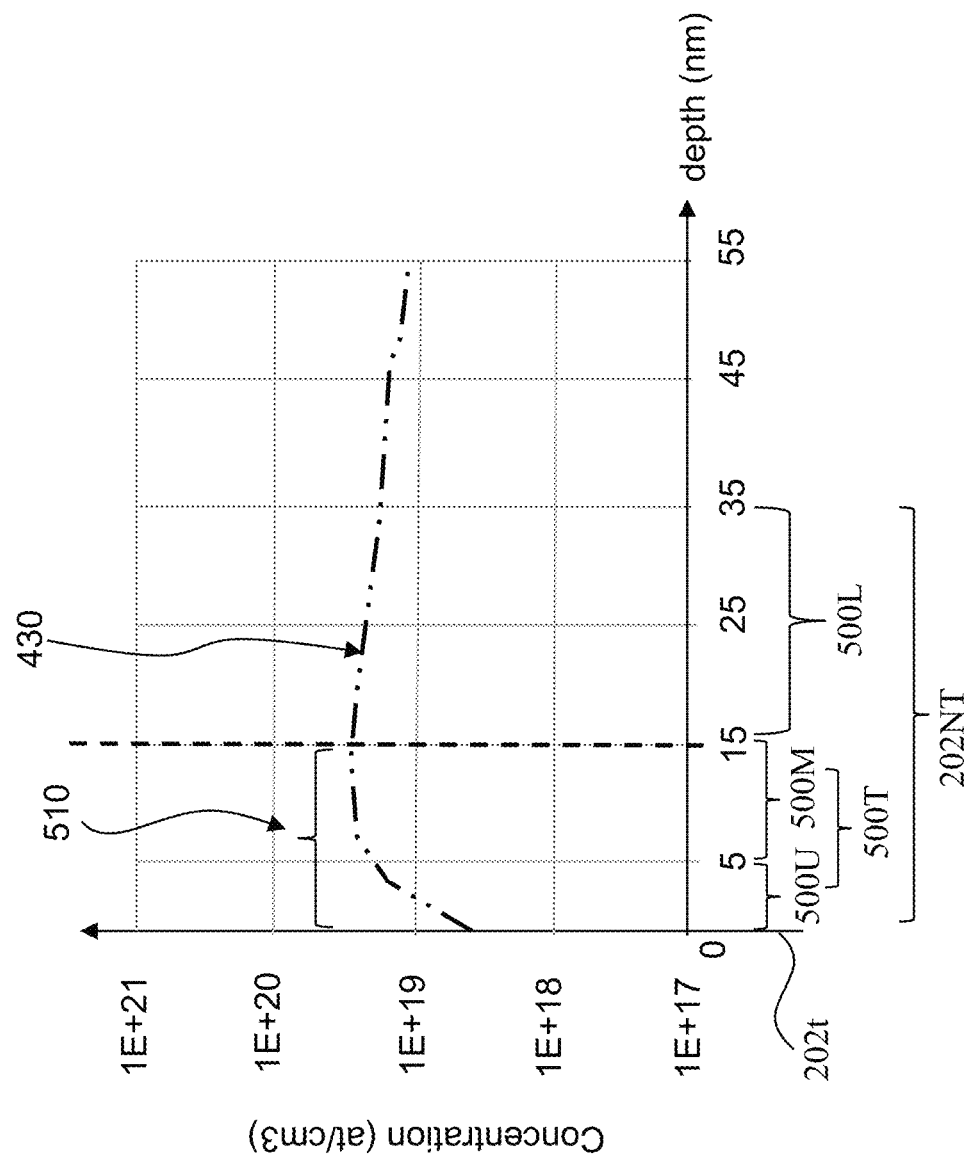
FIG. 21 illustrates a doping profile of the doped region after performing a pre-bake process.

The pre-bake process 218 may be performed in the second process chamber 216b under a pressure that is less than 300 Torr. If the pressure is greater than 300 Torr, the efficiency of the removal of the undesirable components (e.g., oxide) and thus the quality of semiconductor layers that would be formed on the substrate 202 may be reduced. One or more gases, such as helium (He), nitrogen (N2), argon (Ar), hydrogen ($H_2$), combinations thereof, and/or other suitable gases may be provided in the second process chamber 216b with a flow rate of about 0.1 standard liter per minute (slm) to about 50 slm. It is noted that, the gas environment in the second process chamber 216b is substantially free of oxygen, thereby preventing undesired oxidation of the substrate 202 during the pre-bake process 218. That is, a partial pressure of oxygen may be substantially equal to 0. In an embodiment, the gas environment in the second process chamber 216b is substantially filled by hydrogen ($H_2$) to accelerate the removal of the pad oxide layer (e.g., the first hard mask layer 204) and/or the unintentionally formed oxidized layer on the top surface 202t of the substrate 202. In some embodiments, during the pre-bake process 218, the partial pressure of H2 in the second process chamber 216b is greater than a partial pressure of H2 associated with the anneal process 212. After the pre-bake process 218, a doping profile of the n-type doped region 202N is changed due to thermal diffusion caused by the pre-bake process 218. A doping profile of the n-type doped region 202N after the pre-bake process 218 is shown in FIG. 21 and represented by curve 430.

Figures 8A, 8B:
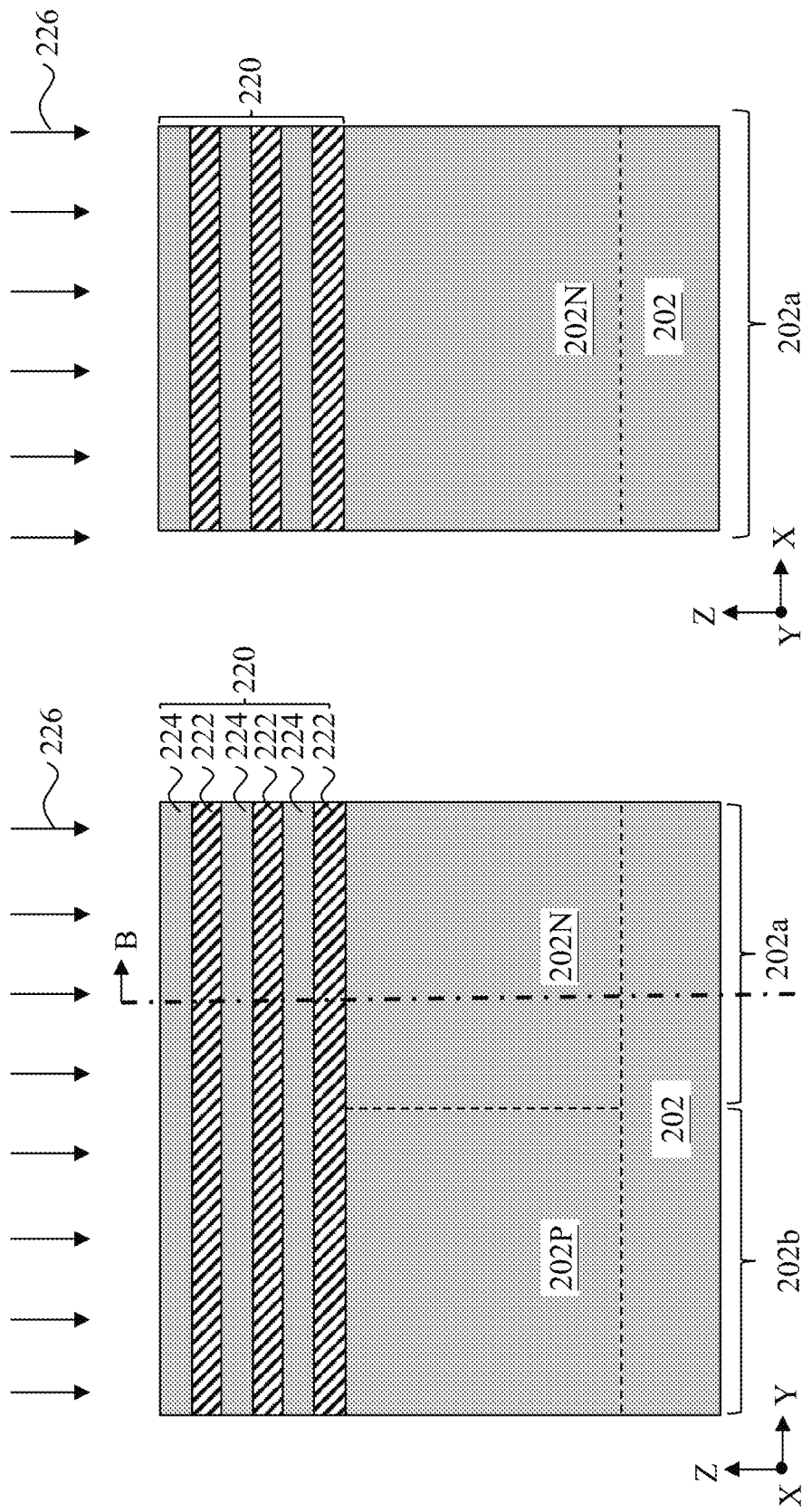

Referring to FIGS. 1, 7C, 8A and 8B, method 100 includes a block 112 where a vertical stack 220 of alternating sacrificial layers 222 and channel layers 224 are deposited on the substrate 202. After performing the pre-bake process 218, the workpiece 200 may still be positioned in the second process chamber 216b and semiconductor layers (e.g., semiconductor layers 222 and 224 shown in FIGS. 8A-8B) may be epitaxially grown on the top surface of the substrate 202. The vertical stack 220 is formed by depositing sacrificial layers 222 and channel layers 224 over substrate 202 in an interleaving or alternating configuration from the top surface 202t of the substrate 202. For example, a first one of the sacrificial layers 222 is epitaxially grown on the substrate 202, a first one of the channel layers 224 is epitaxially grown on the first one of the sacrificial layers 222, a second one of the sacrificial layers 222 is epitaxially grown on the first one of the channel layers 224, and so on until the vertical stack 220 has a desired number of sacrificial layers 222 and channel layers 224. In such embodiments, sacrificial layers 222 and channel layers 224 can be referred to as epitaxial layers. Sacrificial layers 222 and channel layers 224 may be epitaxially grown by molecular beam epitaxy (MBE), chemical vapor deposition (CVD), other suitable epitaxial growth process, or combinations thereof. It is noted that three sacrificial layers 222 and three channel layers 224 are alternately and vertically arranged as illustrated in FIGS. 8A-8B, which are for illustrative purposes only and not intended to limit the present disclosure to what is explicitly illustrated therein. It is understood that any number of sacrificial layers 222 and channel layers 224 can be formed in the stack 220. In some embodiments, the number of the channel layers 224 is between 2 and 10.

Each channel layer 224 may include a semiconductor material such as, silicon, germanium, silicon carbide, silicon germanium, GeSn, SiGeSn, SiGeCSn, other suitable semiconductor materials, or combinations thereof, while each sacrificial layer 222 has a composition different from that of the channel layer 224. In an embodiment, the channel layer 224 includes silicon (Si), the sacrificial layer 222 includes silicon germanium (SiGe). In an embodiment, the sacrificial layers 222 and the channel layers 224 are formed by a selective CVD process 226 that introduces a silicon-containing precursor and a germanium-containing precursor and a carrier gas into the second process chamber 216b, where the silicon-containing precursor and the germanium-containing precursor interact with semiconductor surfaces of the workpiece 200 to form the sacrificial layers 222 and the channel layers 224, respectively. The silicon-containing precursor includes $SiH_4$, $Si_2H_6$, $SiH_2Cl_2$, $SiHCl_3$, $SiCl_4$, other suitable silicon-containing precursors, or combinations thereof. The germanium-containing precursor includes $GeH_4$, $Ge_2H_6$, $GeCl_4$, $GeCl_2$, other suitable germanium-containing precursors, or combinations thereof. The carrier gas may be an inert gas, such as H2, N2, H2, or Ar. In some embodiments, the sacrificial layers 222 and channel layers 224 may be epitaxially grown in a same process chamber 216b.

In some embodiments, during the epitaxial growth of the sacrificial layers 222 and channel layers 224, the gas environment in the second process chamber 206b is substantially free of oxygen, thereby preventing undesired oxidation of the channel layers 224 and the sacrificial layers 222 during the selective CVD process 226. That is, a partial pressure of oxygen may be substantially equal to 0.

In an embodiment, the selective CVD process 226 is performed in the second process chamber 216b at temperature T3 for a time duration t3 and under a pressure that is less than 300 Torr to form satisfactory channel layers 224 and sacrificial layers 222. The thermal budget of the selective CVD process 226 may be greater than the thermal budget of the pre-bake process 218. To reduce dopants in the n-type doped region 202N/p-type doped region 202P from being thermally diffused and thus provide a satisfactory doping profile in the mesa region, the selective CVD process 226 is performed at temperature T3 that is lower than the pre-bake temperature T2. In an embodiment, the process temperature T3 of the selective CVD process 226 is between about 600° C. and about 800° C. When the process temperature T3 is below 600° C., the growth rate of the epitaxial layers may be too slow. When the process temperature T3 is above 800° C., the quality of the deposited epitaxial layers may deteriorate. The defects caused by the ion implantation process 210 may be further repaired by the selective CVD process 226 due to the thermal effect at an elevated temperature. Considering the thermal budget and the process temperature T3 of the selective CVD process 226 and the number of semiconductor layers that would be formed in the stack 220, the process temperature T3 may be maintained for a duration t3 that is measured by minutes or hours and greater than the duration t2 of the pre-bake process 218.

A doping profile of the n-type doped region 202N after the selective CVD process 226 is shown in FIG. 21 and is represented by curve 510. The top portion 202NT of the n-type doped region 202N includes an upper region 500U (shown in FIG. 21), a middle region 500M, and a lower region 500L. A dopant concentration of the upper region 500U is less than a dopant concentration of the middle region 500M, and the dopant concentration of the middle region 500M is greater than a dopant concentration of the lower region 500L. As shown in FIG. 21, after performing the selective CVD process 226, the dopant concentration of the upper region 500U is greater than 8E17 atom/cm$^3$, the dopant concentration of the middle region 500M is greater than 8E18 atom/cm$^3$. In some embodiments, as will be described below, the upper region 500U and the middle region 500M would be collectively patterned to form a mesa region 500T in the first portion 202a and a mesa region 500T' in the second portion 202b. By providing the mesa region 500T having a doping profile (e.g., curve 510) shown in FIG. 21, leakage current associated with the mesa region 500T may be reduced, thereby providing a better device performance.

Referring to FIGS. 1, 9A and 9B, method 100 includes a block 114 where a second hard mask layer 228 is formed on the vertical stack 220. In embodiments represented in FIGS. 9A and 9B, the second hard mask layer 228 includes a pad oxide layer 228a and a pad nitride layer 228b formed on the pad oxide layer 228a. The pad oxide layer 228a may include silicon oxide and may be formed by a second process 230. The second process 230 may include a thermal oxidation process that has a thermal budget less than the thermal budget of the first process 206 and less than the thermal budget of the pre-bake process 218. The second process 230 may be performed under a pressure ranging from about 1500 mTorr to about 4500 mTorr and at a process temperature T4 ranging from about 60° C. to about 390° C. in a process environment that may include one or more reaction gases such as $O_2$ and/or SAM24 ($C_8H_{22}N_2Si$) for a duration t4 of several minutes with a flow rate ranging from about 1 slm to about 10 slm. Carrier gases such as $H_2$, $N_2$, Ar, and/or He may be used to transport the reaction gases into a furnace or a process chamber. The process temperature T4 is designed such that the formation of the second hard mask layer 228 will not significantly affect the mesa region's doping profile (e.g., represented by the curve 510). The pad nitride layer 228b may include silicon nitride and may be formed by CVD, ALD, or other suitable processes. It is understood that, in some embodiments, the process temperature for forming the pad nitride layer 228b may be lower than the pre-bake temperature T2 of the pre-bake process 218 to reduce dopants' thermal diffusion.

Referring to FIGS. 1, 9A, 9B, 10A and 10B, method 100 includes a block 116 where the vertical stack 220 and an upper portion 202U of the substrate 202 are patterned to form a number of fin-shaped active regions 232. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The second hard mask layer 228 may be patterned using the patterned photoresist layer as an etch mask, and the vertical stack 220 and the upper portion 200U of the substrate 202 may be then patterned using the patterned second hard mask layer 228 as an etch mask. After the patterning, each of the fin-shaped active regions 232 includes a patterned vertical stack 220 and a patterned upper portion 202U of the substrate 202. The patterned upper portion 202U in the first portion 202a of the substrate 202 is referred to as a mesa region 500T and the patterned upper portion 202U in the second portion 202b of the substrate 202 is referred to as a mesa region 500T'. The doping profile 510 of the mesa region 500T is shown in FIG. 21. The doping profile of the mesa region 500T' may be in a way similar to the doping profile 510 of the mesa region 500T and is omitted for reason of simplicity. The mesa region 500T and mesa region 500T' may each have a depth (from the top surface 202t of the substrate 202) along the-Z direction. In an embodiment, the depth may be between about 10 nm and about 20 nm to facilitate the formation of a satisfactory isolation feature between two adjacent active regions.

Referring to FIGS. 1, 9A, 9B, 10A and 10B, method 100 includes a block 116 where the vertical stack 220 and an upper portion 200U of the substrate 202 are patterned to form a number of fin-shaped active regions 232. The patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The second hard mask layer 228 may be patterned using the patterned photoresist layer as an etch mask, and the vertical stack 220 and the upper portion 200U of the substrate 202 may be then patterned using the patterned second hard mask layer 228 as an etch mask. After the patterning, each of the fin-shaped active regions 232 includes a patterned vertical stack 220 and a patterned upper portion 202U of the substrate 202. The patterned upper portion 202U in the first portion 202a of the substrate 202 is referred to as a mesa region 500T and the patterned upper portion 202U in the second portion 202b of the substrate 202 is referred to as a mesa region 500T'. The doping profile 510 of the mesa region 500T is shown in FIG. 21. The doping profile of the mesa region 500T' may be in a way similar to the doping profile 510 of the mesa region 500T and is omitted for reason of simplicity. The mesa region 500T and mesa region 500T' may each have a depth (from the top surface 202t of the substrate 202) along the −Z direction. In an embodiment, the depth may be between about 10 nm and about 20 nm to facilitate the formation of a satisfactory isolation feature between two adjacent active regions.

Figures 10A, 10B:
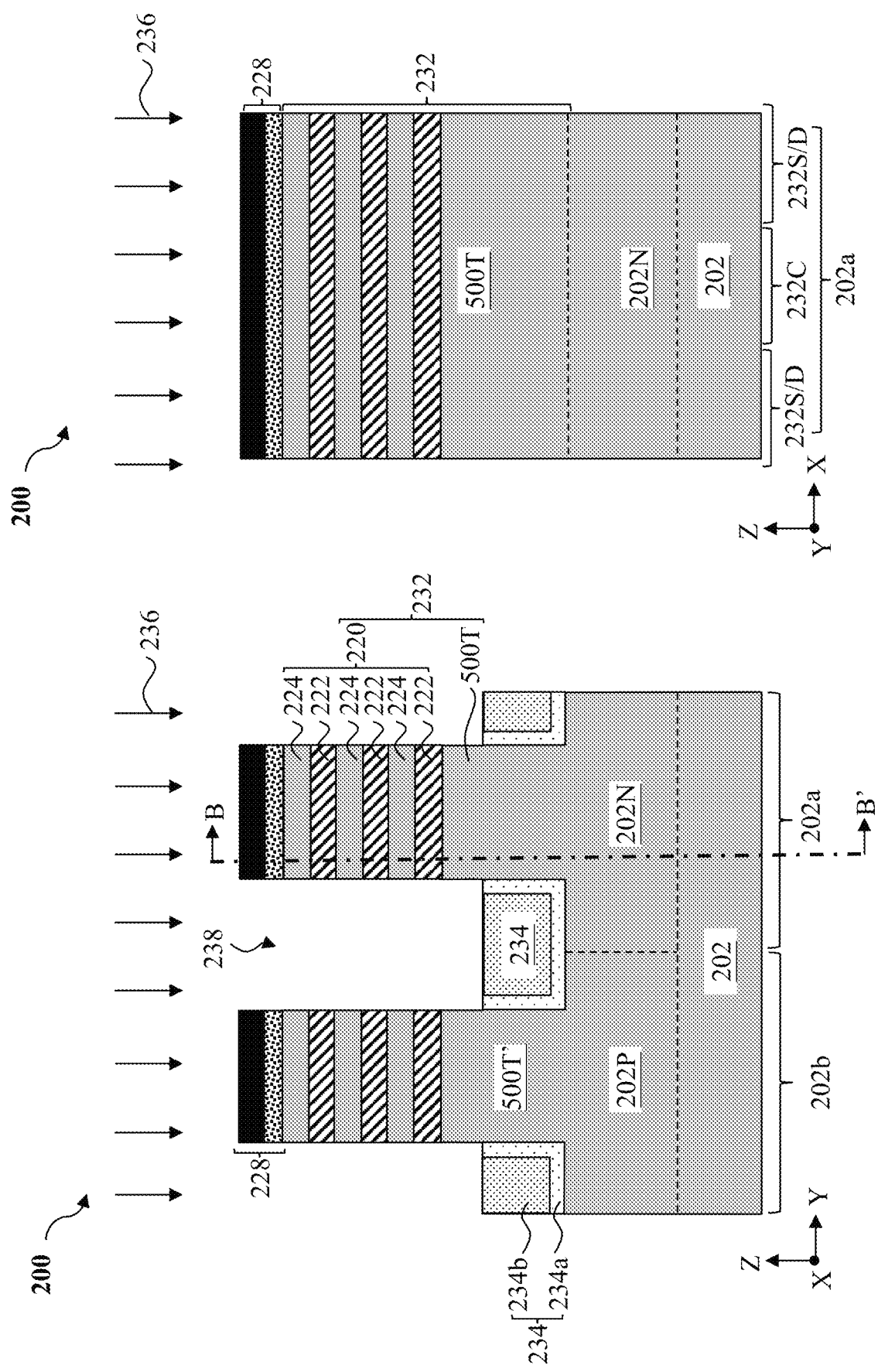

As shown in FIGS. 10A and 10B, each of the fin-shaped active regions 232 extends lengthwise along the X direction and includes channel regions 232C and source/drain regions 232S/D. Source/drain region(s) may refer to a source region or a drain region, individually or collectively dependent upon the context. Each channel region 232C is disposed between two source/drain regions 232S/D. FIG. 10B depicts a cross-sectional view of the workpiece 200 taken along line B-B' shown in FIG. 10A. It is noted that the number of fin-shaped active regions 232 formed over the substrate 202 and the numbers of the channel regions and source/drain regions shown in FIGS. 10A and 10B are for illustrative purposes only and not intended to limit the present disclosure to what is explicitly illustrated therein.

Still referring to FIGS. 1, 10A and 10B, method 100 includes a block 118 where isolation structures 234 are formed to isolate two adjacent fin-shaped active regions 232. In embodiments represented in FIGS. 10A and 10B, the formation of the isolation structures 234 includes forming an oxide liner 234a and forming a nitride fill layer 234b over the oxide liner 234a. The formation of the oxide liner 234a may be in a way similar to the formation of the pad oxide layer 228a. For example, the oxide liner 234a may include silicon oxide and may be formed by a thermal oxidation process that has a thermal budget less than the thermal budget of the pre-bake process 218 and repeated description is omitted for reason of simplicity. The formation of the nitride fill layer 234b may be performed by using a deposition process such as a flowable CVD process 236 and may have a thermal budget greater than the thermal budget of the second process 230 (shown in FIGS. 9A-9B) to fill trenches between two adjacent fin-shaped active regions 232. The flowable CVD process 236 may be performed under 1 atmosphere (atm) and at a process temperature T5 in a furnace that may include one or more reaction gases such as $H_2O$ and $N_2$ for a duration t5. Carrier gases such as $H_2$, Ar, and/or He may be used to transport the reaction gases into the furnace. In this embodiment, the process temperature T5 is greater than the process temperature T4 for forming the pad oxide layer 228a and is lower than the process temperature T3 for forming the vertical stack 220 such that the performing of the flowable CVD process 236 would not significantly affect the doping profile (e.g., curve 510) of the mesa region 500T while providing the nitride fill layer 234b a satisfactory trench filling capability to provide satisfactory isolation structure 234 for the workpiece 200. That is, T4<T5<T3<T2. In an embodiment, the process temperature T5 ranges between about 400° C. to about 800° C. Considering the thermal budget of the flowable CVD process 236, and the process temperature T5 of the flowable CVD process 236 and the height of the fin-shaped active regions 232, the duration t5 of the flowable CVD process 236 may be between about 4 and 10 hours and is greater than the duration t2 of the pre-bake process 218.

In some embodiments, the isolation structure 234 may be a single-layer structure and may be formed of any suitable materials such as tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), and may be formed by any suitable method such as CVD, spin-on-glass (SOG), other suitable methods, or combinations thereof.

After forming the nitride fill layer 234b over the oxide liner 234a, a chemical-mechanical planarization/polishing (CMP) process may be performed until the top surface of the hard mask layer 228 is exposed. The oxide liner 234a and the nitride fill layer 234b are then etched back to form the isolation structure 234 and a trench 238 that exposes a top surface of the isolation structure 234 and sidewall surfaces of two adjacent fin-shaped active regions 232.

Referring to FIGS. 1, 11A and 11B, method 100 includes a block 120 where cladding layers 240 are formed over the workpiece 200 and extending along sidewall surfaces of each of the fin-shaped active regions 232. In the present embodiments, the cladding layers 240 may have a composition substantially the same as that of the sacrificial layer 222, such that they may be selectively removed by a common etching process. In the present embodiment, the cladding layers 240 are formed of SiGe. In some embodiments, the formation of the cladding layers 240 may include conformally depositing a material layer over surfaces of the workpiece 200 to partially fill the trench 238 and performing an anisotropic etching process to selectively remove portions of the material layer that are not extending along sidewalls of the fin-shaped active regions 232, thereby exposing portions of the isolation structure 234 and a top surface of the hard mask layer 228.

Still referring to FIGS. 1, 11A and 11B, method 100 includes a block 122 where a hybrid fin 241 is formed between two adjacent cladding layers 240 to substantially fill the trench 238. In an embodiment, the hybrid fin 241 includes a dummy fin 242 and a helmet layer 244 formed on the dummy fin 242. The dummy fin 242 is a dielectric feature and may be a multi-layer structure or a single layer structure and may include silicon nitride, silicon carbonitride (SiCN), silicon oxycarbonitride (SiOCN), silicon oxide, silicon carbide, FSG, combinations thereof, or other suitable dielectric materials and may be formed by any suitable deposition process. A top surface of the dummy fin 242 may be coplanar with a top surface of the topmost channel layer 224. The helmet layer 244 may be a high-k dielectric layer and may include aluminum oxide, aluminum nitride, aluminum oxynitride, zirconium oxide, zirconium nitride, zirconium aluminum oxide, hafnium oxide, other high-k material, or a suitable dielectric material and may be deposited by a CVD process, an ALD process, a PVD process, and/or other suitable process. The workpiece 200 is then planarized using a CMP process to remove excess portions of the helmet layer 244 on the hard mask layer 228. In some implementations, the helmet layer 244 may be configured to isolate two adjacent gate structures.

Referring to FIGS. 1, 12A, 12B, 13A and 13B, method 100 includes a block 124 where a dummy gate structure 246 is formed over channel regions 232C of the fin-shaped active regions 232. As shown in FIGS. 12A and 12B, after forming the helmet layer 244, the workpiece 200 is etched to selectively remove the hard mask layer 228 and a portion of the cladding layer 240 that extends along the sidewalls of the hard mask layer 228 without substantially etching the helmet layer 244 or the topmost channel layer 224. In some implementations, the etching process employed in block 124 may include a selective dry etching process. In some implementations, the etching process may include a selective wet etching process (e.g., selective to SiGe) that includes ammonium hydroxide (NH$_4$OH), hydrogen fluoride (HF), hydrogen peroxide (H$_2$O$_2$), or a combination thereof. After the etching process, the cladding layers 240 and the topmost channel layers 224 are substantially coplanar.

Figures 13A, 13B:
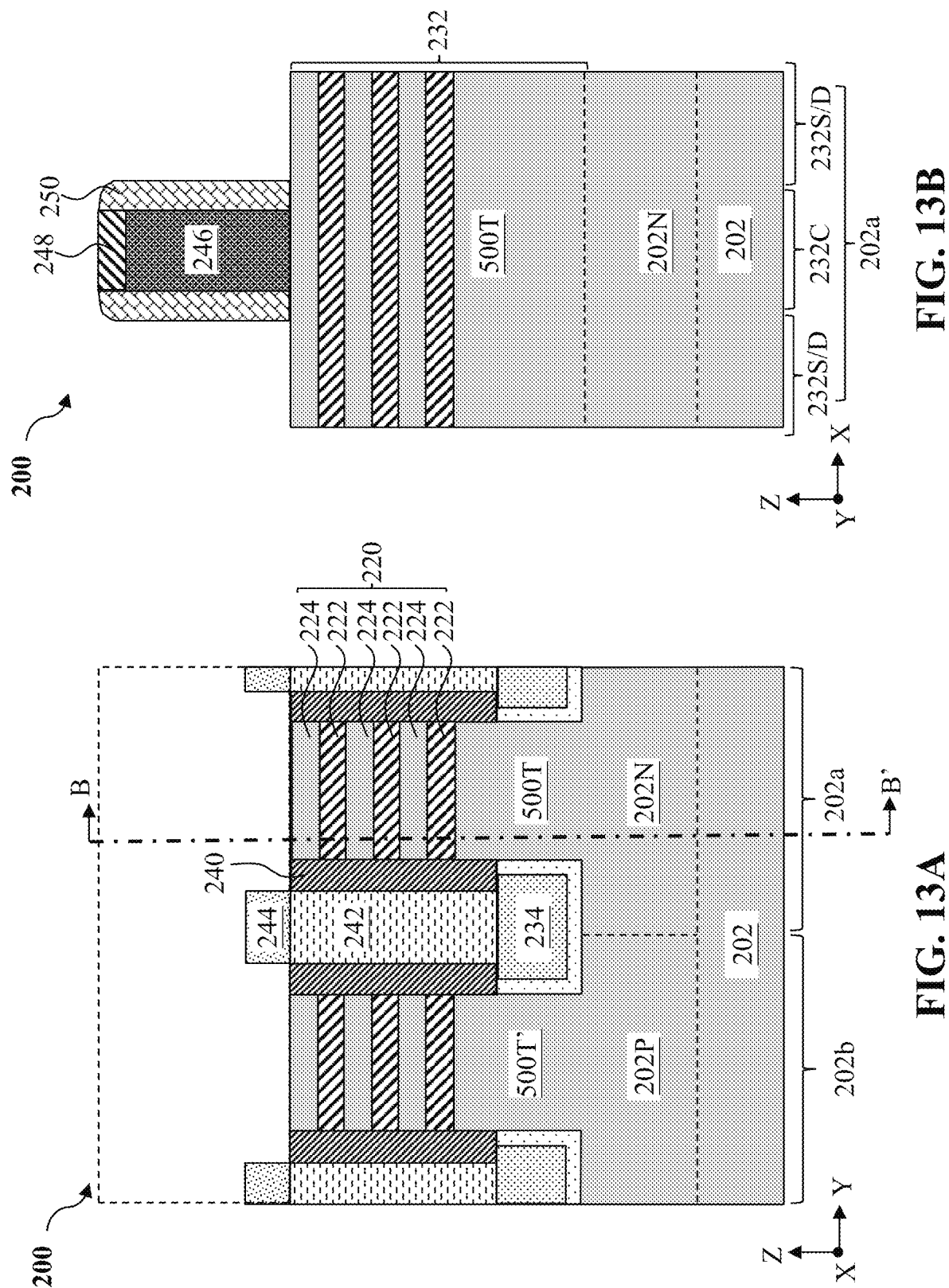

In embodiments represented in FIGS. 13A and 13B, a dummy gate structure 246 is then formed over channel regions 232C of the fin-shaped active regions 232. In this embodiment, a gate replacement process (or gate-last process) is adopted where the dummy gate structure 246 serves as a placeholder for a functional gate stack. Other processes and configurations are possible. While not explicitly shown, the dummy gate structure 246 may include a dummy dielectric layer and a dummy electrode disposed over the dummy dielectric layer. In some embodiments, the dummy dielectric layer may include silicon oxide and the dummy electrode may include polycrystalline silicon (polysilicon). A gate-top mask 248 is formed on the dummy gate structure 246. After forming the dummy gate structure 246, a gate spacer 250 is formed along sidewalls of the dummy gate structure 246 and the gate-top mask 248. Dielectric materials for the gate spacer 250 may be selected to allow selective removal of the dummy gate structure 246 without substantially damaging the gate spacer 250. The gate spacer 250 may include silicon nitride, silicon oxycarbonitride, silicon carbonitride, silicon oxide, silicon oxycarbide, silicon carbide, silicon oxynitride, and/or combinations thereof.

Figure 14B:
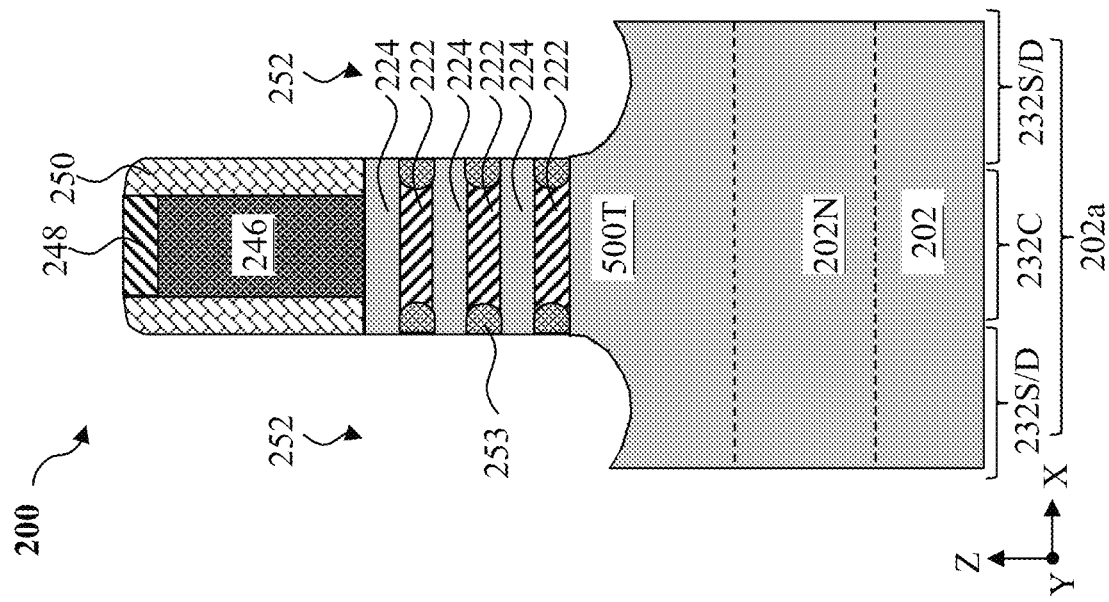
Figure 14A:
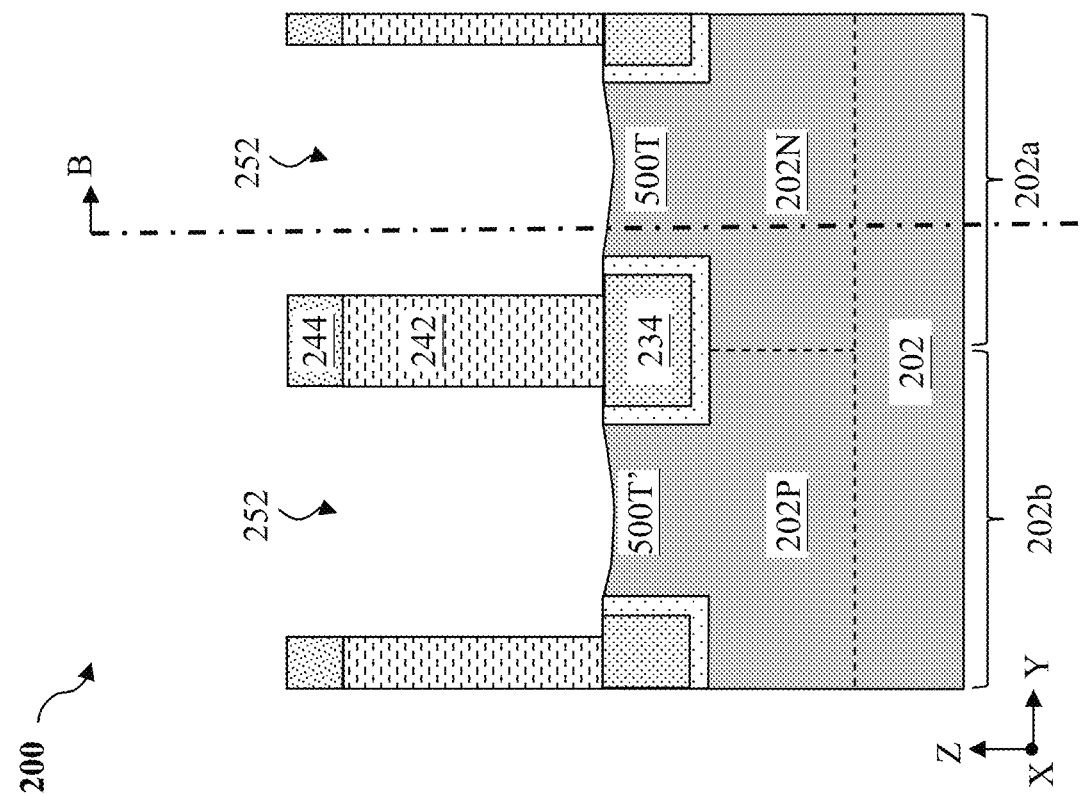

Referring to FIGS. 1, 14A and 14B, method 100 includes a block 126 where source/drain regions 232S/D of the fin-shaped active regions 232 are recessed to form source/drain trenches 252. With the dummy gate structure 246 and the gate spacer 250 serving as an etch mask, the source/drain regions 232S/D of the fin-shaped active regions 232 and a portion of the cladding layers 240 not covered by the dummy gate structure 246 are removed by an anisotropic etching process to form source/drain trenches 252. The anisotropic etching process in block 126 may include a dry etching process and may implement hydrogen, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, other suitable gases and/or plasmas, and/or combinations thereof. Source/drain trenches 252 may not only extend through the stack 220, but also extend through a portion of the substrate 202.

Still referring to FIGS. 1, 14A and 14B, method 100 includes a block 128 where inner spacer features 253 are formed in the workpiece 200. After forming the source/drain trenches 252, the sacrificial layers 222 exposed in the source/drain trenches 252 are selectively and partially recessed to form inner spacer recesses (filled by inner spacer features 253), while the exposed channel layers 224 are substantially unetched. In some embodiments, this selective recess may include a selective isotropic etching process (e.g., a selective dry etching process or a selective wet etching process), and the extent at which the sacrificial layers 222 is recessed is controlled by duration of the etching process. After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 253.

Figure 15B:
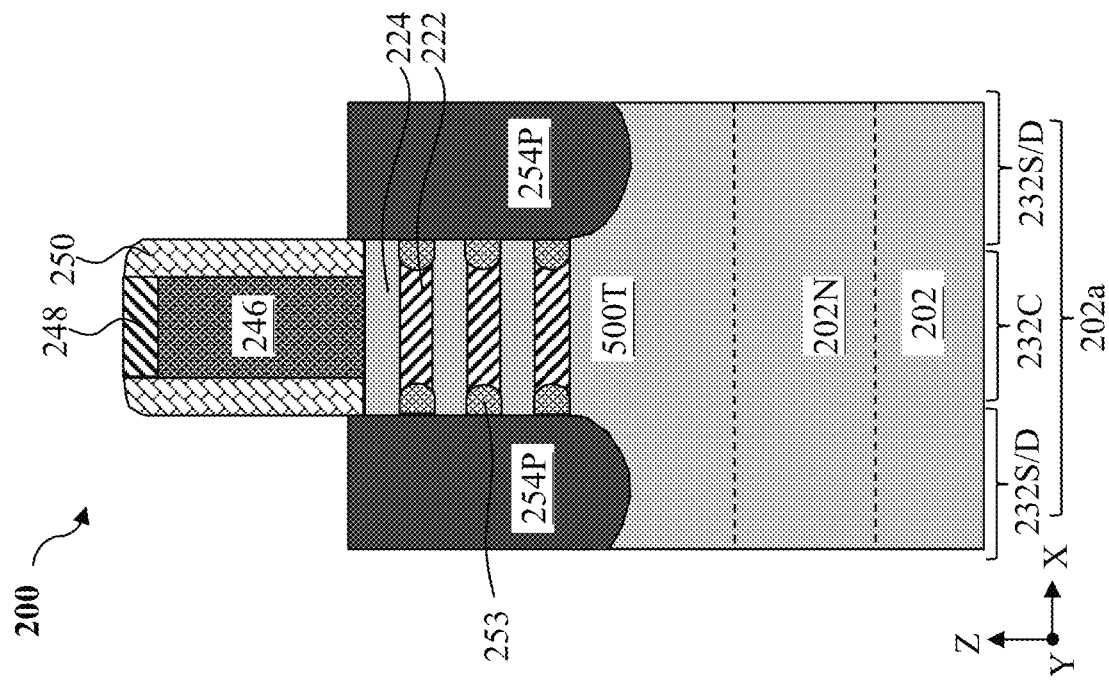
Figure 15A:
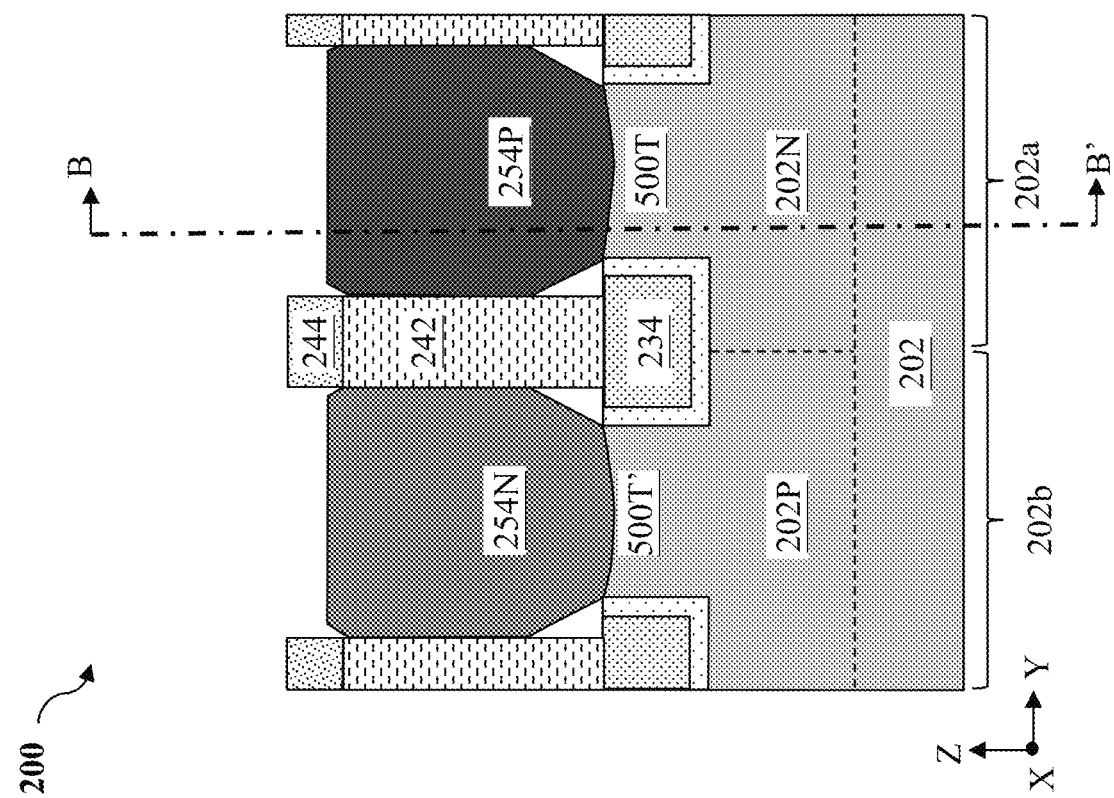
Figure 16B:
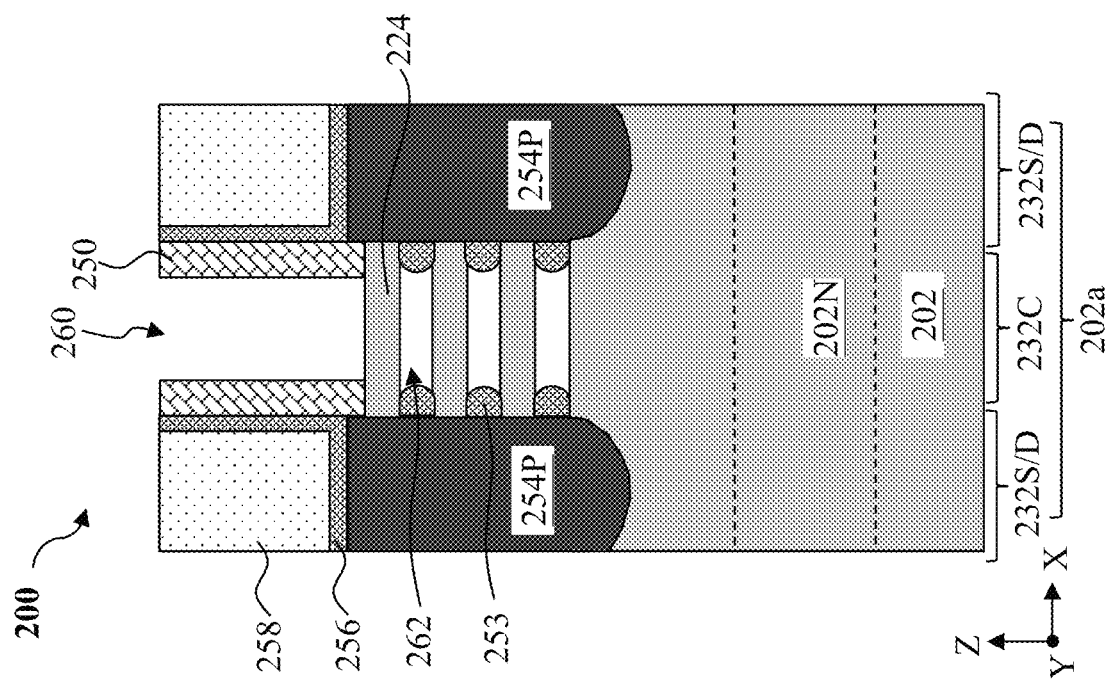
Figure 16A:
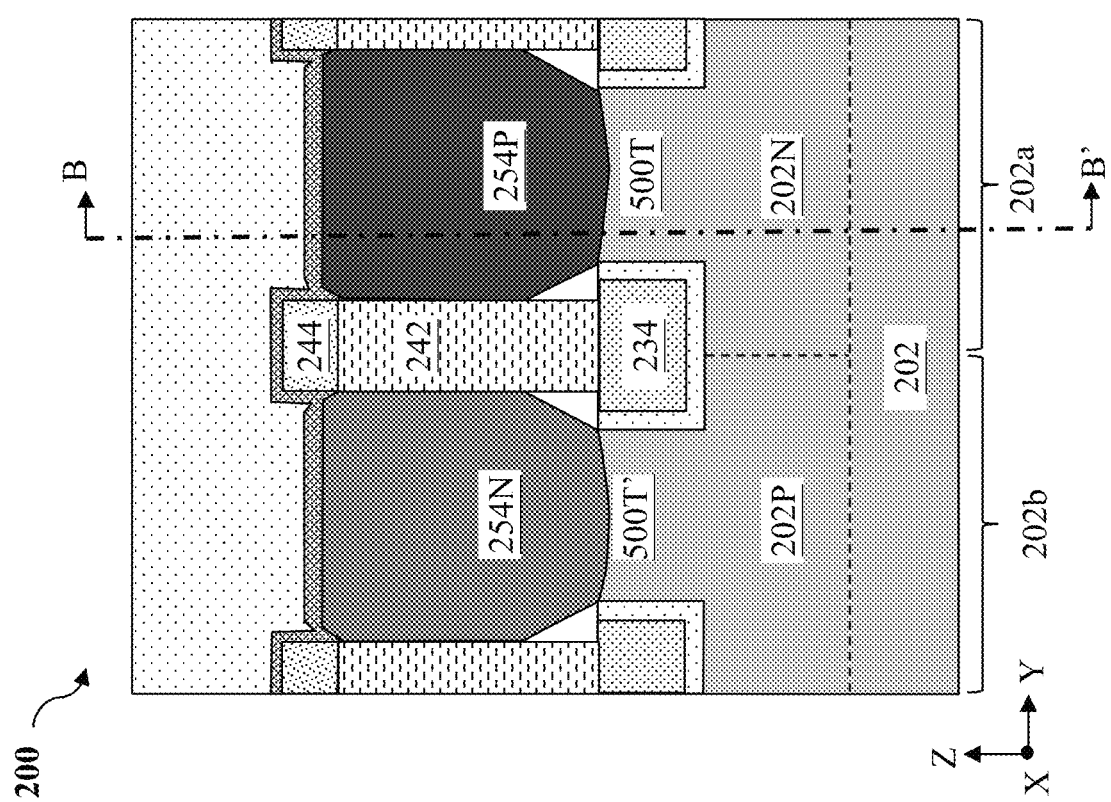

Referring to FIGS. 1, 15A and 15B, method 100 includes a block 130 where epitaxial source/drain features 254N and 254P are formed in the source/drain trenches 252. Source/drain feature(s) may refer to a source or a drain, individually or collectively dependent upon the context. N-type source/drain features 254N are formed in source/drain trenches 252 over the second portion 202b and p-type source/drain features 254P are formed in source/drain trenches 252 over the first portion 202a. The n-type source/drain features 254N and the p-type source/drain features 254P each may be epitaxially and selectively formed from exposed top surfaces of the substrate 202 and exposed sidewalls of the channel layers 224 by using an epitaxial process, such as VPE, UHV-CVD, MBE, and/or other suitable processes. The n-type source/drain features 254N are coupled to the channel layers 224 over the second portion 202b and may include silicon, phosphorus-doped silicon, arsenic-doped silicon, antimony-doped silicon, or other suitable material and may be in-situ doped during the epitaxial process by introducing an n-type dopant, such as phosphorus, arsenic, or antimony, or ex-situ doped using a junction implant process. The p-type source/drain features 254P are coupled to the channel layers 224 over the first portion 202a and may include germanium, gallium-doped silicon germanium, boron-doped silicon germanium, or other suitable material and may be in-situ doped during the epitaxial process by introducing a p-type dopant, such as boron or gallium, or ex-situ doped using a junction implant process.

Referring to FIGS. 1, 16A, 16B, 17A and 17B, method 100 includes a block 132 where the dummy gate structure 246 is replaced by functional gate stacks (e.g., gate stack 265). After forming the source/drain features 254N and 254P, a contact etch stop layer (CESL) 256 and an interlayer dielectric (ILD) layer 258 are deposited over the workpiece 200. The CESL 256 may include silicon nitride, silicon oxynitride, and/or other suitable materials and may be formed by ALD, plasma-enhanced chemical vapor deposition (PECVD) process and/or other suitable deposition or oxidation processes. The CESL 256 may be deposited on top surfaces of the source/drain features 254N-254P and sidewalls of the gate spacer 250. The ILD layer 258 is deposited by a PECVD process or other suitable deposition technique over the workpiece 200 after the deposition of the CESL 256. The ILD layer 258 may include any suitable materials such as tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG)).

An etching process may be performed to selectively remove the dummy gate structure 246 to form gate trenches such as gate trench 260. Another etching process may be then followed to selectively remove the sacrificial layers 222 without substantially removing the channel layers 224 to form a number of gate openings 262. In the present embodiments, the etching process in this channel release process also removes the cladding layer 240 previously covered by the dummy gate structure 246. After forming the gate trenches (e.g., gate trench 260) and gate openings 262, a gate stack 265 is formed in the gate trench 260 and the gate openings 262 to wrap around each of the channel members 224 over the first portion 202a. Similarly, a gate stack may be formed over the workpiece 200 to wrap around each of the channel members 224 over the second portion 202b. Each of the gate stacks include an interfacial layer. In some embodiments, the interfacial layer may include silicon oxide. A gate dielectric layer is then deposited over the interfacial layer using ALD, CVD, and/or other suitable methods. The gate dielectric layer may include high-k dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide, zirconium silicon oxide ($ZrSiO_2$), lanthanum oxide ($La_2O_3$), aluminum oxide ($Al_2O_3$), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HMO), $(Ba,Sr)TiO_3$ (BST), silicon nitride (SiN), silicon oxynitride (SiON), combinations thereof, or other suitable material. A gate electrode layer is then deposited over the gate dielectric layer. The gate electrode layer may be a multi-layer structure that includes at least one work function layer and a metal fill layer. By way of example, the gate stack formed over the second portion 202b may include an n-type work function metal layer such as Ti, Al, Ag, Mn, Zr, TiAl, TiAlC, TaC, TaCN, TaSiN, TaAl, TaAlC, TiAlN, other n-type work function material, or combinations thereof, and the gate stack 265 may include a p-type function metal layer such as TiN, TaN, Ru, Mo, Al, WN, $ZrSi_2$, $MoSi_2$, $TaSi_2$, $NiSi_2$, WCN, other p-type work function material, or combinations thereof.

Figure 17B:
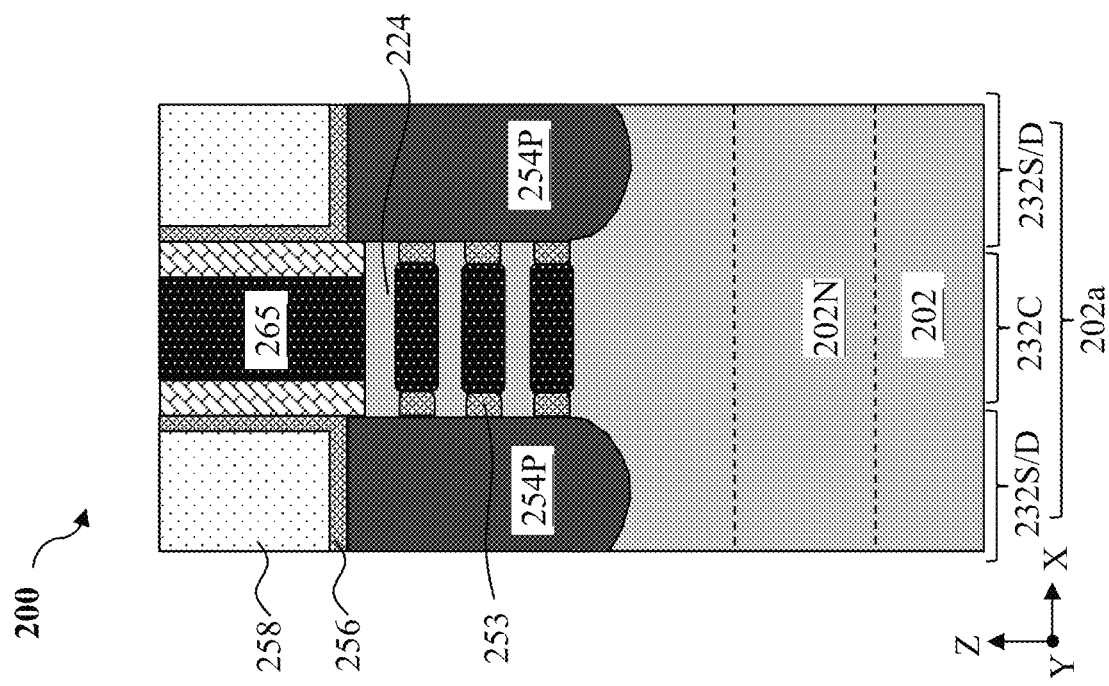
Figure 17A:
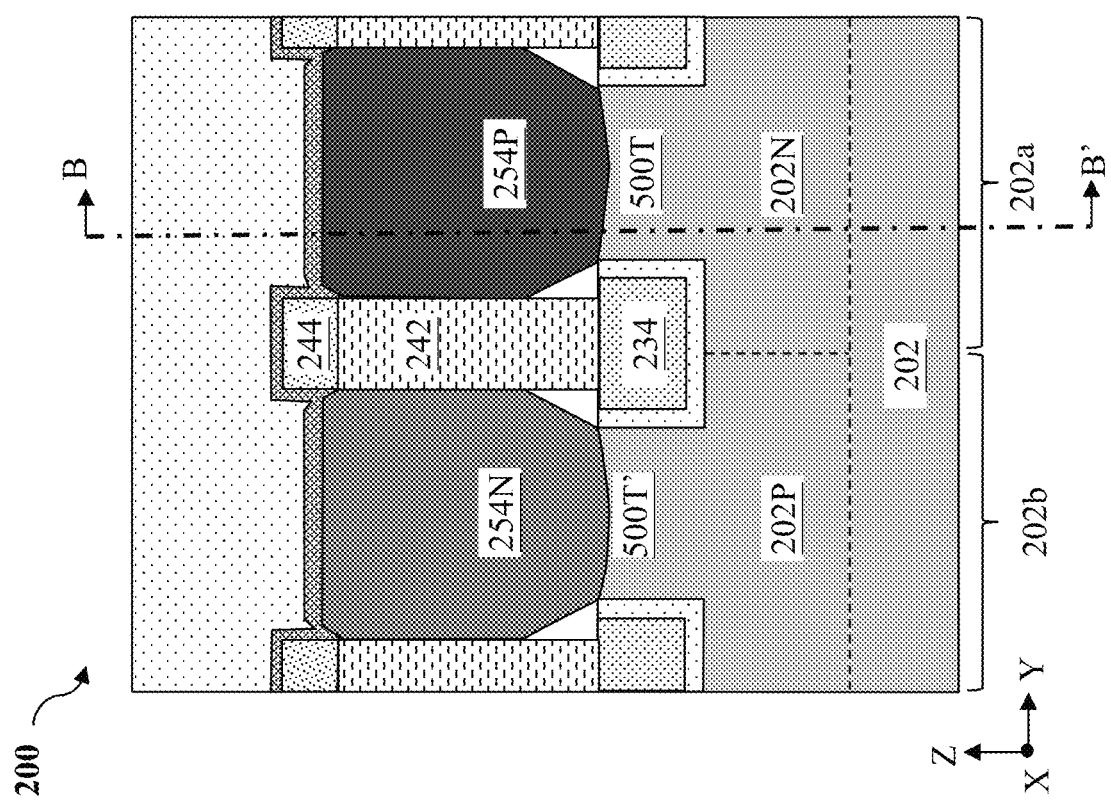
Figure 18:
FIG. 18 illustrates a flowchart of an exemplary method for determining and fine-tuning parameters of thermal treatments involved in the fabrication stages in the method of FIG. 1, according to various embodiments of the present disclosure.

Referring to FIGS. 1, 17A and 17B, method 100 includes a block 134 where further processes may be performed to complete the fabrication of the semiconductor device 200. For example, method 100 may further include recessing the gate stacks, forming dielectric capping layer over the recessed gate stacks. Such further processes may also include forming an interconnect structure configured to connect the various features to form a functional circuit that includes the different semiconductor devices. The interconnect structure may include multiple interlayer dielectric (ILD) layers and multiple metal lines, contact vias, and/or power rails in each of the ILD layers. The metal lines, contact vias, and/or power rails in each ILD layer may be formed of metal, such as aluminum, tungsten, ruthenium, or copper.

In the above embodiments, parameters such as temperatures, durations, process pressures, and/or flow rates associated with various fabrication processes (e.g., the first process 206 for forming the first hard mask layer 204, the anneal process 212, the pre-bake process 218, the selective CVD process 226, the second process 230 for forming the second hard mask layer 228, the flowable CVD process 236) are described. The thermal budgets of those fabrication processes are determined such that the mesa region 500T and the mesa region 500T' each may have a satisfactory doping profile in the final semiconductor device 200, thereby reducing leakage current. FIG. 18 illustrates a flowchart of an exemplary method 300 for determining and fine-tuning temperatures and durations of thermal treatments for performing the method of FIG. 1, according to various embodiments of the present disclosure.

Referring to FIG. 18, method 300 includes a block 302 where an anneal temperature T1 and a duration t1 for the anneal process 212 are determined. The anneal temperature T1 is configured such that the anneal process 212 would activate dopants in the n-type doped region 202N and/or dopants in the p-type doped region 202P and also facilitate movement of the dopants from interstitial sites to substitutional lattice sites to reduce dislocations in crystal lattice and repair defects caused by the ion implantation process 210. In the present embodiment, the anneal temperature T1 is between about 950° C. and about 1200° C. The duration t1 of the anneal process 212 may be then determined based on the thermal budget of the anneal process 212 and a whole thermal budget of the entire fabrication processes illustrated in method 100, according to embodiments of the present disclosure.

Still referring to FIG. 18, method 300 includes a block 304 where a process temperature T3 and duration t3 of the epitaxial growth (e.g., the selective CVD process 226) for forming the stack 220 are determined. The process temperature T3 is selected such that the deposited epitaxial layers (e.g., channel layers 224 and sacrificial layers 222) may have satisfactory quality while being formed in an acceptable duration to increase production. The duration t3 of the epitaxial growth for forming the stack 220 may be then determined based on, for example, the thickness of the stack 220, the process temperature T3, and the thermal budget of the epitaxial growth for forming the stack 220. In an embodiment, the process temperature T3 is between about 600° C. and about 800° C. To fine tune the pre-bake temperature T2 of the pre-bake process 218 and thus provide a satisfactory doping profile for the mesa region 500T, an initial process temperature T3 may be set to $T3_0$ (e.g., 600° C.), and the initial duration t3 may be determined accordingly. It is understood that operations in block 304 and operations in block 302 may be performed in any sequential order. For example, operations in block 304 may be performed before performing the operations in block 302.

Referring to FIG. 18, method 300 includes a block 306 where a pre-bake temperature T2 and duration t2 of the pre-bake process 218 are determined. The pre-bake temperature T2 is initially determined such that any undesirable components (i.e., oxide residue and/or unintentionally formed oxidized layer) may be removed, the solvent in the substrate 202 may be evaporated, and the defects caused by the anneal process 212 may be significantly reduced. That is, the pre-bake temperature T2 is no less than the desorption temperature (e.g., about 700° C.) of the unintentionally formed oxidized layer. In an embodiment, the pre-bake temperature T2 may be initially set to $T2_0$. The duration t2 of the pre-bake process 218 may be determined based on a thermal budget of the pre-bake process 218 and the initial pre-bake temperature T2.

Referring to FIG. 18, method 300 includes a block 308 where operations in blocks of method 100 are performed under the predetermined conditions (e.g., the initial temperatures $T2_0$, $T3_0$ and corresponding durations of the pre-bake process 218 and the selective CVD process 226) to fabricate a first test device. The first test device may be in a way similar to the semiconductor device 200 except for the doping profile of the mesa region. More specifically, increasing the pre-bake temperature T2 would repair more defects caused by the anneal process, thereby reducing leakage current. However, increasing the pre-bake temperature T2 would also increase dopants' thermal diffusion and lead to a decreased dopant concentration in the mesa region, resulting an increased leakage current.

Referring to FIG. 18, method 300 includes a block 310 where a doping profile of the mesa region of the first test device ("test doping profile") is obtained and the leakage current associated with the mesa region of the first test device ("test leakage current") is the evaluated to determine whether the test doping profile is a satisfactory doping profile. In situations where the leakage current is greater than a predetermined threshold, the test doping profile is not a satisfactory doping profile. If the test doping profile is not a satisfactory doping profile, method 300 moves to block 314 where the pre-bake temperature T2 of the pre-bake process 218 is reduced from the initial pre-bake temperature $T2_0$ to an adjusted pre-bake temperature T2'. After reducing the initial pre-bake temperature, method 300 moves to block 316 where the duration of the pre-bake process 218 is prolonged from the initial duration to an adjusted duration, based on the thermal budget of the pre-bake process 218 and the adjusted pre-bake temperature. After determining the adjusted pre-bake temperature T2' and adjusted duration for the pre-bake process 218, method 300 moves to block 318 where the process temperature T3 of the epitaxial growth (e.g., the selective CVD process 226) for forming the stack 220 is adjusted. Since the pre-bake temperature T2 is reduced, the number of defects that would be repaired by the pre-bake process 218 may be reduced. To reduce the total number of defects in the final semiconductor device 200, the process temperature T3 of the epitaxial growth for forming the stack 220 may be increased from $T3_0$ to T3' to repair more defects. It is understood that, after adjusting, the process temperature T3' would still be between about 600° C. and about 800° C. For example, an initial process temperature $T3_0$ may be about 600° C., and after the adjusting, the process temperature T3' may be about 640° C. After determining the adjusted process temperature T3' for the epitaxial growth for forming the stack 220, method 300 moves to block 320 where the growth duration of the epitaxial growth may be determined (e.g., shortened) accordingly without substantially changing the thermal budget of the epitaxial growth process.

After adjusting the temperatures and durations of the pre-bake process 218 and the selective CVD process 226, method 300 loops back to block 308 where operations in blocks of method 100 are performed under the adjusted fabrication parameters (e.g., the adjusted temperatures T2', T3', and durations) to fabricate a second test device. The doping profile of the mesa region of the second test device is then evaluated. If the doping profile of the mesa region of the second test device is a satisfactory doping profile, method 300 moves to block 312 where the adjusted fabrication parameters (e.g., the adjusted temperatures and durations) used to fabricate the second test device may be used in actual fabrication of semiconductor devices (e.g., the semiconductor device 200). Otherwise, the method 300 may loop back to the blocks 314-320 and the temperatures and durations of the pre-bake process 218 and the selective CVD process 226 may be further adjusted.

Figure 19A:
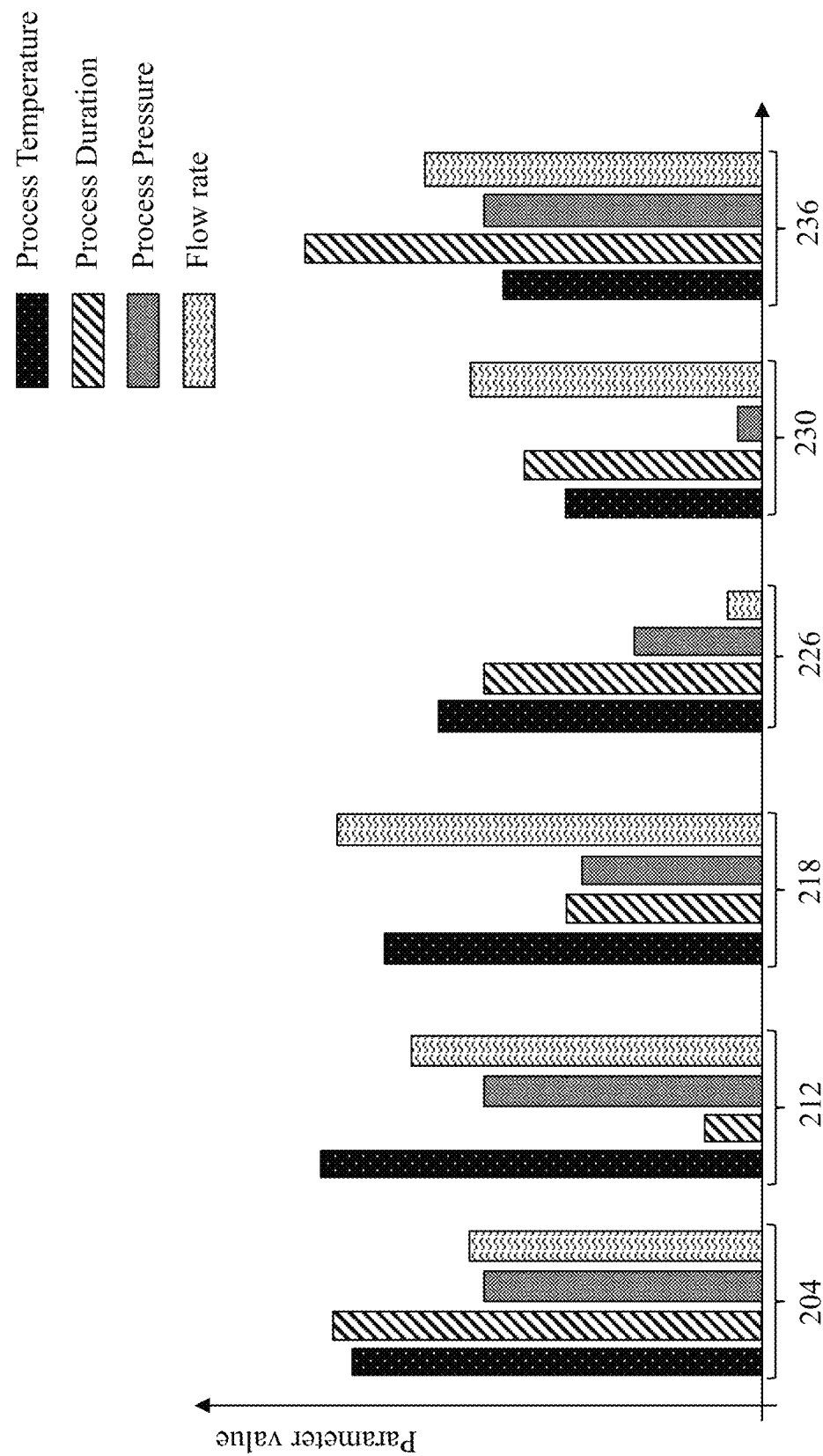
FIG. 19A illustrates a bar chart showing the relationships among parameters of the thermal treatments, according to various embodiments of the present disclosure.

FIG. 19A illustrates a bar chart showing the relationships among parameters of thermal treatments for performing the method of FIG. 1 and FIG. 19B illustrates a table showing ranges of the parameters of thermal treatments for performing the method of FIG. 1, according to various embodiments of the present disclosure. More specifically, relationships of the process temperatures, process durations, process pressures and gas flow rates of the first process 206, anneal process 212, pre-bake process 218, selective CVD process 226, the second process 230 and the flowable CVD process 236 are illustrated in FIG. 19A. Some of the relationships, for example, the relationships among those process temperatures and relationships among those process durations, may be obtained by method 300. It is understood that the satisfactory doping profile (e.g., doping profile (e.g., curve 510) shown in FIG. 21) of the mesa region 500T of the semiconductor device 200 is a function of the thermal budgets as well as the respective temperatures and durations of the anneal process 212, the pre-bake process 218, the epitaxial growth process (e.g., the selective CVD process 226) and a function of the thermal budget of a rest of fabrication processes (e.g., flowable CVD process 236) performed after the performing of the epitaxial growth process. Detailed various relationships among those parameters (e.g., temperature, duration, process pressure, flow rate) in various thermal treatments are shown in FIG. 19A and detailed ranges of those parameters are shown in FIG. 19B, and repeated description is omitted for reason of simplicity.

FIG. 20 illustrates doping profiles of the n-type doped region 202N of the workpiece 200 before and after the performing of the anneal process 212. Curve 410 represents the doping profile of the n-type doped region 202N before the performing of the anneal process 212, and curve 420 represents the doping profile of the n-type doped region 202N after the performing of the anneal process 212. In embodiments represented in FIG. 20, before the anneal process 212, a dopant concentration of a top portion of the n-type doped region 202N (i.e., the top portion 202NT) is higher than a dopant concentration of a bottom portion of the n-type doped region 202N (i.e., the bottom portion 202NP). After the anneal process 212, the dopant concentration of the top portion 202NT is reduced comparing to that of the top portion 202NT before the anneal process 212, the dopant concentration of the bottom portion 202NP is increased comparing to that of the bottom portion 202NP before the anneal process 212, and, after the anneal process 212, the dopant concentration of the top portion 202NT is still higher than the dopant concentration of the bottom portion 202NP. In embodiments represented in FIG. 20, the top portion 202NT refers to the region of the n-type doped region 202N that ranges from the top surface 202t of the substrate 202 to a depth of about 35 nm in the n-type doped region 202N, and the bottom portion 202NB is a rest of the n-type doped region 202N.

FIG. 21 illustrates a curve 430 representing a doping profile of the top portion 202NT after the performing of the pre-bake process 218. A portion 510 of the curve 430 ("the curve 510") represents a doping profile of an upper portion (i.e., the mesa region 500T) of the top portion 202NT after the performing of the epitaxial grow process (e.g., the selective CVD process 226). In embodiments represented in FIG. 21, after the selective CVD process 226, the dopant concentration of the mesa region 500T is higher than 8E17 atom/cm$^3$ and is not substantially uniform throughout its depth along the Z axis. More specifically, the mesa region 500T includes a region 500U near the top surface 202t of the substrate and a region 500M under the region 500U. A dopant concentration of the region 500U is higher than 8E17 atom/cm$^3$, and a dopant concentration of the region 500M is greater than a dopant concentration of the region 500U and is higher than 8E18 atom/cm$^3$. By providing the mesa region such a doping profile, leakage current associated with the mesa region 500T may be advantageously reduced, thereby providing better device performance.

Although not intended to be limiting, one or more embodiments of the present disclosure provide many benefits to a semiconductor device and the formation thereof. For example, the present disclosure provides a method of forming a semiconductor device that has a satisfactory doping profile in the mesa region of the semiconductor device. Thermal budgets, process temperatures and process durations are configured such that unrepaired defects caused by ion-implantation process and dopant diffusions caused by various thermal treatments are both in acceptable ranges, thereby reducing leakage current without yielding significant penalty. Embodiments of the disclosed methods can be readily integrated into existing processes and technologies for manufacturing GAA FETs.

The present disclosure provides for many different embodiments. Semiconductor devices and methods of fabrication thereof are disclosed herein. In one exemplary aspect, the present disclosure is directed to a method. The method includes providing a workpiece comprising a first hard mask layer on a top surface of a substrate, performing an ion implantation process to form a doped region in the substrate, after the performing of the ion implantation process, annealing the workpiece at temperature T1, selectively removing the first hard mask layer, after the selectively removing of the first hard mask layer, performing a pre-bake process at temperature T2, and after the performing of the pre-bake process, epitaxially growing a vertical stack of alternating channel layers and sacrificial layers on the substrate. The temperature T2 is lower than the temperature T1.

In some embodiments, the epitaxially growing of the vertical stack may be performed at temperature T3, wherein T3 is lower than T2. In some embodiments, the performing of the pre-bake process may include placing the workpiece in a first chamber of a chemical vapor deposition (CVD) tool, and the epitaxially growing of the vertical stack may be performed in the first chamber. In some embodiments, the performing of the pre-bake process may include exposing the substrate to a first gas environment in the first chamber to remove a residue of the first hard mask layer, the first hard mask layer may include an oxide layer, and the first gas environment may include hydrogen (H2). In some embodiments, the annealing of the workpiece may include exposing the substrate to a second gas environment that includes hydrogen (H2), the hydrogen in the second gas environment may have a partial pressure that is different from a partial pressure of the hydrogen in the first gas environment. In some embodiments, the method may also include, after the epitaxially growing of the vertical stack, forming a second hard mask layer over the vertical stack at temperature T4, and the temperature T4 may be lower than the temperature T1 and the temperature T2. In some embodiments, the method may also include patterning the vertical stack and an upper portion of the substrate to form fin-shaped active regions, each of the fin-shaped active regions may include a patterned vertical stack formed over a mesa region of the substrate, forming an isolation structure to isolate two adjacent fin-shaped active regions, forming a dummy gate structure over channel regions of the fin-shaped active regions, forming source/drain features in and over source/drain regions of the fin-shaped active regions, each of the channel regions being disposed between two source/drain features, selectively removing the dummy gate structure and the sacrificial layers, and forming a gate stack to wrap around each of the channel layers. In some embodiments, after the forming of the gate stack, a dopant concentration of the mesa region may be greater than 8E17 atom/cm3. In some embodiments, the mesa region may include an upper portion and a lower portion, and a dopant concentration of the lower portion may be greater than a dopant concentration of the upper portion.

In another exemplary aspect, the present disclosure is directed to a method. The method includes forming a dielectric layer on a substrate, after the forming of the dielectric layer, forming a doped region in the substrate, performing an anneal process to the substrate at temperature T1 for a duration t1, after the performing of the anneal process, selectively removing the dielectric layer, after the selectively removing of the dielectric layer, pre-baking the substrate at temperature T2 for a duration t2, and forming a vertical stack of alternating epitaxial semiconductor layers on the substrate at temperature T3 for a duration t3, where the temperature T2 is lower than the temperature T1 and is greater than the temperature T3, and the duration t2 is less than the duration t3 and is greater than the duration t1.

In some embodiments, the temperature T1 may be between about 950° C. and about 1200° C. In some embodiments, the temperature T2 may be between about 700° C. and about 1000° C. In some embodiments, the temperature T3 may be between about 600° C. and about 800° C. In some embodiments, the anneal process may be performed in a first gas environment, the pre-baking of the substrate may be performed in a second gas environment, and a partial pressure of oxygen in the second gas environment may be less than a partial pressure of oxygen in the first gas environment. In some embodiments, the forming of the doped region may include performing an ion implantation process.

In some embodiments, the method may include patterning the vertical stack and a top portion of the substrate to form an active region, the active region comprising a patterned vertical stack formed on a patterned top portion of the substrate, forming a gate structure over a channel region of the active region, and forming source/drain features over source/drain regions of the active region. After the patterning, a dopant concentration of the patterned top portion of the substrate may be greater than 8E17 atom/cm3. In some embodiments, before the performing of the anneal process, the doped region includes an upper portion having a first dopant concentration and a lower portion having a second dopant concentration different from the first dopant concentration, and after the performing of the anneal process, the first dopant concentration may decrease, and the second dopant concentration may increase.

In yet another exemplary aspect, the present disclosure is directed to a semiconductor structure. The semiconductor structure includes forming an oxide dielectric layer on a substrate, performing an ion implantation process to form a doped region in the substrate, performing a first thermal treatment to the substrate in a first gas environment and at temperature T1 for a duration t1, after the performing of the first thermal treatment, selectively removing the oxide dielectric layer, after the selectively removing of the oxide dielectric layer, performing a second thermal treatment to the substrate in a second gas environment and at temperature T2 for a duration t2, and epitaxially forming a vertical stack of semiconductor layers on the substrate in a third gas environment and at temperature T3 for a duration t3. The temperature T2 is lower than the temperature T1 and is greater than the temperature T3, the duration t2 is less than the duration t3 and is greater than the duration t1, and a partial pressure of hydrogen in the second gas environment is different than a partial pressure of hydrogen in the first gas environment.

In some embodiments, a partial pressure of oxygen in the second gas environment may be substantially equal to 0. In some embodiments, the temperature T2 may be greater than a desorption temperature of the oxide dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    providing a workpiece comprising a first hard mask layer on a top surface of a substrate;
    performing an ion implantation process to form a doped region in the substrate;
    after the performing of the ion implantation process, annealing the workpiece at temperature T1;
    selectively removing the first hard mask layer;
    after the selectively removing of the first hard mask layer, performing a pre-bake process at temperature T2, wherein the temperature T2 is lower than the temperature T1;
    after the performing of the pre-bake process, epitaxially growing a vertical stack of alternating channel layers and sacrificial layers on the substrate;
    patterning the vertical stack and a top portion of the substrate to form an active region, the active region comprises a patterned vertical stack formed over a mesa region of the substrate;
    selectively removing the sacrificial layers; and
    forming a gate stack to wrap around the channel layers, wherein, after the forming of the gate stack, the mesa region comprises an upper portion and a lower portion, wherein a dopant concentration of the upper portion is greater than 8E17 atom/cm$^3$, and a dopant concentration of the lower portion is greater than the dopant concentration of the upper portion.

2. The method of claim 1, wherein the epitaxially growing of the vertical stack is performed at temperature T3, wherein T3 is lower than T2.

3. The method of claim 1, wherein the performing of the pre-bake process comprises placing the workpiece in a first chamber of a chemical vapor deposition (CVD) tool, and the epitaxially growing of the vertical stack is further performed in the first chamber.

4. The method of claim 3,
    wherein the performing of the pre-bake process comprises exposing the substrate to a first gas environment in the first chamber to remove a residue of the first hard mask layer,
    wherein the first hard mask layer comprises an oxide layer, and the first gas environment comprises hydrogen ($H_2$).

5. The method of claim 4,
    wherein the annealing of the workpiece comprises exposing the substrate to a second gas environment that includes hydrogen ($H_2$),
    wherein the hydrogen in the second gas environment has a partial pressure that is different from a partial pressure of the hydrogen in the first gas environment.

6. The method of claim 1, further comprising: after the epitaxially growing of the vertical stack, forming a second hard mask layer over the vertical stack at temperature T4,
    wherein the temperature T4 is lower than the temperature T1 and the temperature T2.

7. The method of claim 6, further comprising:
    forming an isolation structure to isolate the active region from adjacent active regions;
    forming a dummy gate structure over a channel region of the active region;
    forming source/drain features in and over source/drain regions of the active regions, wherein the channel region is disposed between two source/drain features; and
    before the selectively removing of the sacrificial layers, selectively removing the dummy gate structure.

8. The method of claim 1, wherein thermal budget of the pre-bake process is less than thermal budget of the annealing.

9. The method of claim 1, wherein the annealing is performed prior to the performing of the pre-bake process.

10. The method of claim 1, wherein the epitaxially forming of the vertical stack and the performing of the pre-bake process are conducted in a same process chamber.

11. A method, comprising:
    forming a dielectric layer on a substrate;
    after the forming of the dielectric layer, forming a doped region in the substrate;
    performing an anneal process to the substrate at temperature T1 for a duration t1;
    after the performing of the anneal process, selectively removing the dielectric layer;
    after the selectively removing of the dielectric layer, pre-baking the substrate at temperature T2 for a duration t2; and
    forming a vertical stack of alternating epitaxial semiconductor layers on the substrate at temperature T3 for a duration t3,
    wherein the temperature T2 is lower than the temperature T1 and is greater than the temperature T3,
    wherein the duration t2 is less than the duration t3 and is greater than the duration t1, and
    wherein the anneal process is performed in a first gas environment, the pre-baking of the substrate is performed in a second gas environment, and a partial pressure of oxygen in the second gas environment is less than a partial pressure of oxygen in the first gas environment.

12. The method of claim 11, wherein the temperature T1 is between about 950° C. and about 1200° C.

13. The method of claim 11, wherein the temperature T2 is between about 700° C. and about 1000° C.

14. The method of claim 11, wherein the temperature T3 is between about 600° C. and about 800° C.

15. The method of claim 11, wherein the forming of the doped region comprises performing an ion implantation process.

16. The method of claim 15, further comprising:
patterning the vertical stack and a top portion of the substrate to form an active region, the active region comprising a patterned vertical stack formed on a patterned top portion of the substrate;
forming a gate structure over a channel region of the active region; and
forming source/drain features over source/drain regions of the active region,
wherein, after the patterning, a dopant concentration of the patterned top portion of the substrate is greater than 8E17 atom/cm$^3$.

17. The method of claim 11,
wherein, before the performing of the anneal process, the doped region includes an upper portion having a first dopant concentration and a lower portion having a second dopant concentration different from the first dopant concentration, and
wherein, after the performing of the anneal process, the first dopant concentration decreases, and the second dopant concentration increases.

18. A method, comprising:
forming an oxide dielectric layer on a substrate;
performing an ion implantation process to form a doped region in the substrate;
performing a first thermal treatment to the substrate in a first gas environment and at temperature T1 for a duration t1;
after the performing of the first thermal treatment, selectively removing the oxide dielectric layer;
after the selectively removing of the oxide dielectric layer, performing a second thermal treatment to the substrate in a second gas environment and at temperature T2 for a duration t2; and
epitaxially forming a vertical stack of semiconductor layers on the substrate in a third gas environment and at temperature T3 for a duration t3,
wherein the temperature T2 is lower than the temperature T1, greater than the temperature T3, and greater than a desorption temperature of the oxide dielectric layer,
wherein the duration t2 is less than the duration t3 and is greater than the duration t1, and
wherein a partial pressure of hydrogen in the second gas environment is different than a partial pressure of hydrogen in the first gas environment.

19. The method of claim 18, wherein a partial pressure of oxygen in the second gas environment is substantially equal to 0.

20. The method of claim 18, wherein the temperature T2 is in a range between about 700° C. and about 1000° C.

* * * * *